(12) United States Patent
Okabe et al.

(10) Patent No.: US 9,366,933 B2
(45) Date of Patent: Jun. 14, 2016

(54) SEMICONDUCTOR DISPLAY DEVICE COMPRISING AN UPPER AND LOWER INSULATOR ARRANGED IN A NON-DISPLAY AREA

(71) Applicant: Sharp Kabushiki Kaisha, Osaka-shi, Osaka (JP)

(72) Inventors: Tohru Okabe, Osaka (JP); Hirohiko Nishiki, Osaka (JP); Takeshi Hara, Osaka (JP); Kenichi Kitoh, Osaka (JP); Hisao Ochi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/428,385

(22) PCT Filed: Sep. 13, 2013

(86) PCT No.: PCT/JP2013/074817
§ 371 (c)(1),
(2) Date: Mar. 16, 2015

(87) PCT Pub. No.: WO2014/046031
PCT Pub. Date: Mar. 27, 2014

(65) Prior Publication Data
US 2015/0241724 A1 Aug. 27, 2015

(30) Foreign Application Priority Data
Sep. 21, 2012 (JP) ................. 2012-208229

(51) Int. Cl.
*G02F 1/136* (2006.01)
*G02F 1/1333* (2006.01)
(Continued)

(52) U.S. Cl.
CPC ............ *G02F 1/1368* (2013.01); *G02F 1/1362* (2013.01); *G02F 1/13439* (2013.01);
(Continued)

(58) Field of Classification Search
CPC ............... G02F 1/133345; G02F 2001/133388
USPC ..................................................... 349/42, 138
See application file for complete search history.

(56) References Cited

U.S. PATENT DOCUMENTS

2009/0224245 A1   9/2009 Umezaki
2010/0012940 A1   1/2010 Sato
(Continued)

FOREIGN PATENT DOCUMENTS

JP    2008-089874 A    4/2008
JP    2010-027851 A    2/2010
(Continued)

OTHER PUBLICATIONS

Official Communication issued in International Patent Application No. PCT/JP2013/074817, mailed on Dec. 10, 2013.

*Primary Examiner* — Paul Lee
(74) *Attorney, Agent, or Firm* — Keating & Bennett, LLP

(57) ABSTRACT

An array board (a semiconductor device) 11b includes a display area TFT (a display area transistor) 17, a non-display area TFT (a non-display area transistor) 29, an upper insulator 31, and a lower insulator 30. The display area TFT 17 is arranged in a display area AA. The non-display area TFT 29 is arranged in a non-display area NAA. The upper insulator 31 is arranged in the non-display area NAA and formed from a second interlayer insulation film 41. The lower insulator 30 is arranged in the non-display area and formed from a first interlayer insulation film 39. The lower insulator 30 is arranged below the upper insulator 31 such that they are layered.

13 Claims, 16 Drawing Sheets

(51) Int. Cl.
*G02F 1/1368* (2006.01)
*H01L 27/12* (2006.01)
*G02F 1/1345* (2006.01)
*G02F 1/1362* (2006.01)
*G02F 1/1343* (2006.01)
*H01L 29/786* (2006.01)

(52) U.S. Cl.
CPC ...... *G02F1/13454* (2013.01); *G02F 1/133345* (2013.01); *G02F 1/136227* (2013.01); *G02F 1/136277* (2013.01); *G02F 1/136286* (2013.01); *H01L 27/1225* (2013.01); *H01L 29/7869* (2013.01); *G02F 2001/133388* (2013.01)

(56) References Cited

U.S. PATENT DOCUMENTS

| | | |
|---|---|---|
| 2010/0133533 A1 | 6/2010 | Umezaki |
| 2011/0102696 A1* | 5/2011 | Yamazaki ........... G02F 1/13458 349/42 |
| 2011/0227066 A1 | 9/2011 | Umezaki |
| 2013/0188110 A1 | 7/2013 | Miyamoto |
| 2014/0061638 A1 | 3/2014 | Umezaki |

FOREIGN PATENT DOCUMENTS

| | | |
|---|---|---|
| JP | 2010-230744 A | 10/2010 |
| WO | 2012/032749 A1 | 3/2012 |

\* cited by examiner

SEMICONDUCTOR DISPLAY DEVICE COMPRISING AN UPPER AND LOWER INSULATOR ARRANGED IN A NON-DISPLAY AREA

TECHNICAL FIELD

The present invention relates to a semiconductor device and a display device.

BACKGROUND ART

A liquid crystal panel in a liquid crystal display device includes TFTs arranged in a matrix. The TFTs are switching components for controlling operations of pixels. In recent years, use of oxide semiconductors having higher electron mobility for semiconductor films is proposed. An example of a liquid crystal display device including TFTs using such oxide semiconductors as switching components is disclosed in Patent Document 1.

RELATED ART DOCUMENT

Patent Document

Patent Document 1: Japanese Unexamined Patent Application Publication No. 2010-230744

Problem to be Solved by the Invention

An oxide semiconductor has high electron movability. Therefore, sizes of TFTs can be reduced and an aperture ratio of a liquid crystal panel can be increased. Furthermore, various circuits can be arranged on an array board on which the TFTs are disposed. However, if an oxide semiconductor absorbs moisture from other films or the outside, an electrical characteristic of the oxide semiconductor is more likely to change. This may cause malfunctions of the circuits.

DISCLOSURE OF THE PRESENT INVENTION

The present invention was made in view of the above circumstances. An object is to provide technology for reducing malfunctions of non-display area transistors.

Means for Solving the Problem

A semiconductor device according to the present invention includes a substrate, a first metal film, a first insulation film, a semiconductor film, a second metal film, a second insulation film, an organic insulation film, a first transparent electrode, a third insulation film, a second transparent electrode film, a display area, a display area transistor, a first transparent electrode, a first insulator, a second transparent electrode, a non-display area, a non-display area transistor, an upper insulator, and a lower insulator. The first metal film is formed on the substrate. The first insulation film is formed on at least the first metal film. The semiconductor film is formed on the first insulation film. The second metal film is formed on at least the semiconductor film. The second insulation film is formed on at least the second metal film. The organic insulation film is formed on the second insulation film. The first transparent electrode film is formed on the organic insulation film. The third insulation film is formed on at least the first transparent electrode film. The second transparent electrode film is formed on at least the third insulation film. The display area is for displaying images on a plate surface of the substrate. The display area transistor is arranged in the display area and includes at least a first gate electrode, a first channel, a first source electrode, and a first drain electrode. The first gate electrode is formed from the first metal film. The first channel is formed from the semiconductor film and arranged so as to overlap the first gate electrode in a plan view. The first source electrode is formed from the second metal film and connected to the first channel. The first drain electrode is formed from the second metal film and connected to the first channel. The first transparent electrode is arranged in the display area and formed from the first transparent electrode film. The first insulator is arranged in the display area and formed from the second insulation film, the organic insulation film, and the third insulation film. The first insulator includes a contact hole that is a through hole formed at a position that overlaps the first drain electrode in a play view. The second transparent electrode is arranged in the display area and formed from the second transparent electrode film. The second transparent electrode is connected to the first drain electrode via the contact hole. The non-display area is arranged outside the display area on the plate surface of the substrate. The non-display area transistor is arranged in the non-display area and includes at least a second gate electrode, a second channel, a second source electrode, and a second drain electrode. The second gate electrode is formed from the first metal film. The second channel is formed from the semiconductor film and arranged so as to overlap the second gate electrode in a plan view. The second source electrode is formed from the second metal film and connected to the second channel. The second drain electrode is formed from the second metal film and connected to the second channel. The upper insulator is arranged in the non-display area and formed from the third insulation film. The lower insulator is arranged in the non-display area and under the upper insulator. The lower insulator is formed from at least the second insulation film.

According to this configuration, when a voltage is applied to the first electrode of the display area transistor arranged in the display area on the plate surface of the substrate, a current flows between the first source electrode and the first drain electrode via the first channel. As a result, the second transparent electrode connected to the first drain electrode is charged and an image is displayed according to a potential difference between the second transparent electrode and the first transparent electrode.

A hygroscopic material is often used for the organic insulation film. If the semiconductor film absorbs moisture contained in the organic insulation film and degrades, an electrical characteristic of the semiconductor film may change. In the display area transistor, a current that flows between the first source electrode and the first drain electrode is small. Therefore, even if the first channel formed from the semiconductor film degrades and an electrical characteristic thereof changes, operation of the display area transistor is less likely to be subject to adverse effect. In the non-display area transistor, a current that flows between the second source electrode and the second drain electrode may be large. If the second channel formed from the semiconductor film in such a non-display area transistor degrades and an electrical characteristic thereof changes, operation of the non-display area transistor is more likely to be subject to adverse effect.

As described above, the non-display area transistor does not include the organic insulation film between the upper insulator, which is formed from the third insulation film, and the lower insulator, which is formed from at least the second insulation film. Therefore, the second channel, which is formed from the semiconductor film, is less likely to degrade and thus the electrical characteristic of the second channel is less likely to change. According to this configuration, a malfunction of the non-display area transistor is less likely to occur.

Preferable embodiments may include the following configurations.

(1) The lower insulator may have a thickness larger than a thickness of the upper insulator. Because the thickness of the lower insulator is larger than the thickness of the upper insulator, a layer below the second insulation film (or the lower insulator) is less likely to be damaged during formation of the third insulation film (or the upper insulator) in a fabrication process of the semiconductor device.

(2) The semiconductor device may further include a protection film arranged at least between the semiconductor film and the second metal film for protecting the semiconductor film. The display area transistor may include a first protection portion formed from the protection film. The first protection portion may include two first through holes at positions that overlap the first channel in a plan view. The first source electrode may be connected to the first channel via one of the first through holes. The first drain electrode may be connected to the first channel via another one of the first through holes. The non-display area transistor may include a second protection portion formed from the protection film. The second protection portion may include two second through holes at positions that overlap the second channel in a plan view. The second source electrode may be connected to the second channel via one of the second through holes. The second drain electrode may be connected to the second channel via another one of the second through holes. The lower insulator may be formed from the second insulation film and the protection film. According to this configuration, the semiconductor film is protected by the protection film that is arranged between the semiconductor film and the second metal film. Therefore, the first channel and the second channel that are formed from the semiconductor film are less likely to be etched during formation of the second metal film in the fabrication process. Furthermore, because the lower insulator is formed from the second insulation film and the protection film, a layer below the second insulation film and the protection film is less likely to be damaged during formation of the third insulation film in the fabrication of the semiconductor device. The first protection portion formed from the protection film includes two first through holes. The first source electrode and the first drain electrode are connected to the first channel via the first through holes. The second protection portion formed from the protection film includes two second through holes. The second source electrode and the second drain electrode are connected to the second channel via the second through holes.

(3) The protection film may be made of silicon oxide. In comparison to silicon nitride or an organic insulation material, the silicon oxide is less likely to cause oxidation or reduction of the semiconductor film. In the display area transistor and the non-display area transistor, the protection film is arranged in the layer above the semiconductor film and protects the semiconductor film. With the protection film made of silicon oxide, the electrical characteristics of the first channel and the second channel formed from the semiconductor film are less likely to change.

(4) In the display area transistor, the thickness of the second insulation film that forms the first insulator is larger than the thickness of the second insulation film that forms the first insulator. Furthermore, the thickness of the second insulation film is equal to the second insulation film that forms the lower insulator of the non-area display transistor. Because the thicknesses of the second insulation film are the same in the display area and the non-display area, the formation of the film completes in a single step. According to this configuration, the tact time can be reduced.

(5) The third insulation film is made of silicon nitride. In comparison to silicon oxide, silicon nitride is more likely to include hydrogen during the formation of film. Therefore, reduction of the semiconductor film may occur due to hydrogen. However, in the non-display area transistor, the thickness of the lower insulator formed from at least the second insulation film is larger than the thickness of the upper insulator formed from the third insulation film and thus the reduction of the second channel formed from the semiconductor film is less likely to occur. Therefore, the electrical characteristic of the second channel is less likely to change.

(6) The organic insulation film is made of acrylic resin. The acrylic resin is a hygroscopic material. Therefore, the semiconductor film may degrade due to moisture from the organic insulation film. However, in the non-display area transistor, the thickness of the lower insulator formed from at least the second insulation film is larger than the thickness of the upper insulator formed from the third insulation film and thus the second channel formed from the semiconductor film is less likely to degrade. Therefore, the electrical characteristic of the second channel is less likely to change.

(7) The semiconductor film is made of an oxide semiconductor. The oxide semiconductor is subject to oxidation or reduction. However, the non-display area transistor does not include the organic insulation film and thus the second channel formed from the semiconductor film is less likely to degrade. Therefore, the electrical characteristic of the second channel is less likely to change.

(8) The semiconductor device further include a scanning line and a buffer circuit. The scanning line is arranged in the display area and connected to the first gate electrode for transmitting a scan signal to the display transistor. The buffer circuit is arranged in the non-display area and connected to the scanning line for supplying the scan signal to the scanning line. The non-display area transistor is a component of the buffer circuit. In the non-display area transistor, which is a component of the buffer circuit, the current that flows between the second source electrode and the second drain electrode tends to be larger than the current that flows between the first source electrode and the first drain electrode in the display area transistor. Therefore, if the semiconductor film that forms the second channel of the non-display transistor degrades due to moisture from other films or the outside and the electrical characteristic thereof changes, a malfunction of the non-display area transistor is more likely to occur. However, as described above, the second channel of the non-display area transistor is less likely to degrade because the non-display area transistor does not include the organic insulation film and thus a malfunction of the non-display area transistor, which is a component of the buffer circuit, is less likely to occur.

(9) The second insulation film is made of silicon oxide. In comparison to silicon nitride of an organic insulation material, silicon oxide is less likely to cause oxidation or reduction of the semiconductor film. In the display area transistor, the second insulation film that forms the lower insulator is made of silicon oxide. With this configuration, the electrical characteristic of the second channel, which is formed from the semiconductor film, is less likely to change.

(10) The first insulation film has a stacking structure in which a lower first insulation film and an upper first insulation film are stacked. The lower first insulation film is made of silicon nitride. The upper first insulation film is arranged between the lower first insulation film and the semiconductor film and made of silicon oxide. In comparison to silicon nitride or an organic insulation material, silicon oxide is less likely to cause oxidation or reduction of the semiconductor film. In the display area transistor and the non-display area transistor, the upper first insulation film arranged between the lower first insulation film and the semiconductor film is made of silicon oxide. With this configuration, the electrical characteristics of the first channel and the second channel formed from the semiconductor film are less likely to change.

(11) The second insulation film and the third insulation film have same patterns in a plan view for an entire area of the display area and an entire area of the non-display area. According to this configuration, after the third insulation film is formed and patterned, the second insulation film can be patterned using the third insulation film as a resist. A mask is not required for patterning of the second insulation film. Therefore, a fabrication facility can be simplified and a fabrication cost can be reduced. Furthermore, the organic insulation film is not used for patterning of the second insulation film as a resist. Therefore, flexibility in design of pattern of the organic insulation film improves and thus the semiconductor device can have a configuration in which the organic insulation film is not arranged between the upper insulator, which is formed from the third insulation film, and the lower insulator, which is formed from at least the second insulation film.

Next, to resolve the problem described earlier, a display device according to the present invention includes the semiconductor device that is described above, a counter substrate, and a liquid crystal layer. The counter substrate is arranged opposite the semiconductor device. The liquid crystal layer is arranged between the semiconductor device and the counter substrate.

According to the display device, the malfunction of the non-display area transistor in the semiconductor device is less likely to occur. Namely, the display device has high operation reliability.

Advantageous Effect of the Invention

According to the present invention, a malfunction of the non-display area transistor in the semiconductor device is less likely to occur.

MODE FOR CARRYING OUT THE INVENTION

First Embodiment

Figure 1:
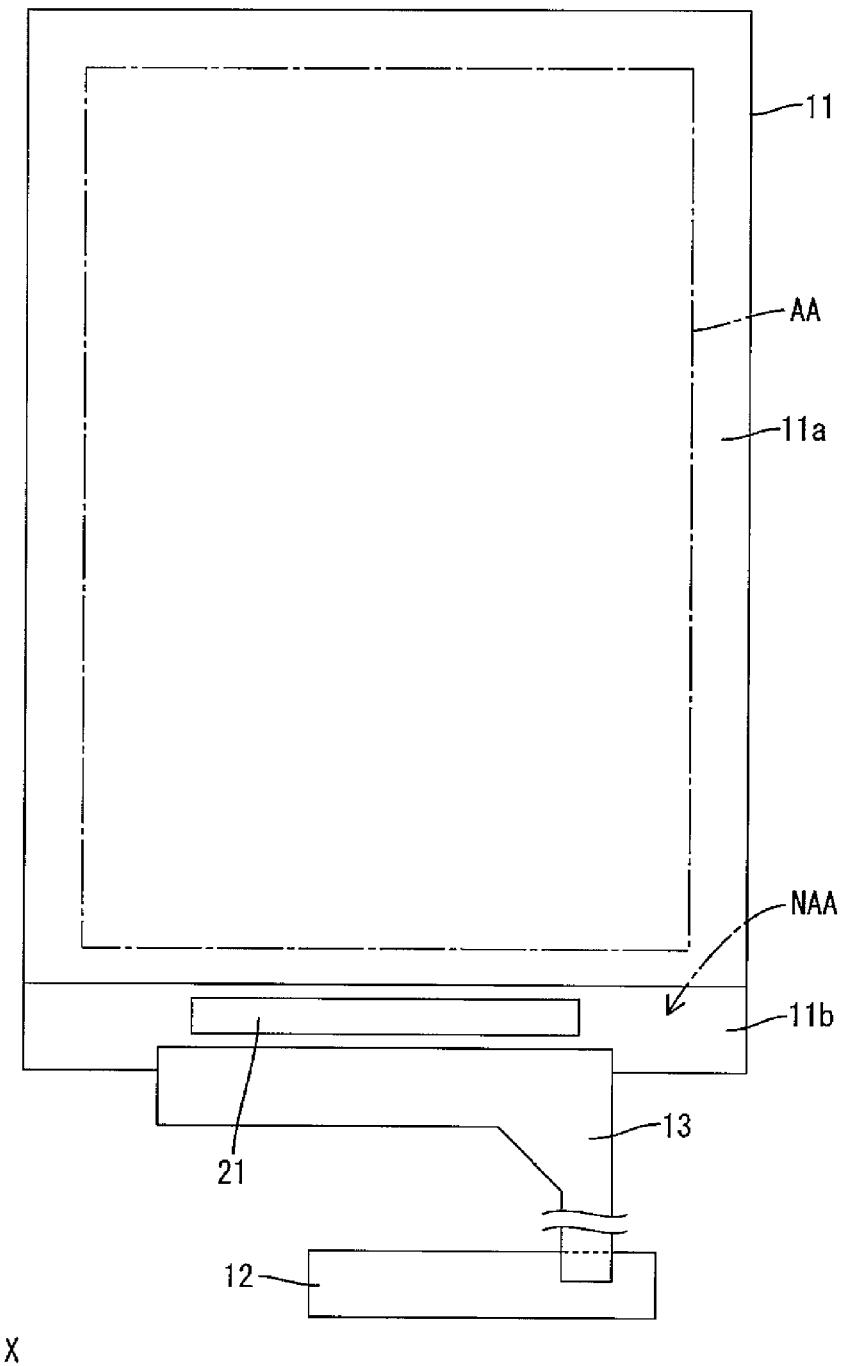
FIG. 1 is a schematic plan view of a liquid crystal panel on which a driver is mounted, a flexible printed circuit board, and a control circuit board according to a first embodiment illustrating connection among those.

A first embodiment will be described with reference to FIGS. 1 to 8. A liquid crystal display device 10 according to this embodiment will be described. X-axis, Y-axis and Z-axis may be indicated in the drawings. The axes in each drawing correspond to the respective axes in other drawings. The vertical direction is defined based on FIG. 2. An upper side and a lower side in FIG. 2 correspond to a front side and a back side of the liquid crystal display device 10, respectively.

Figure 2:
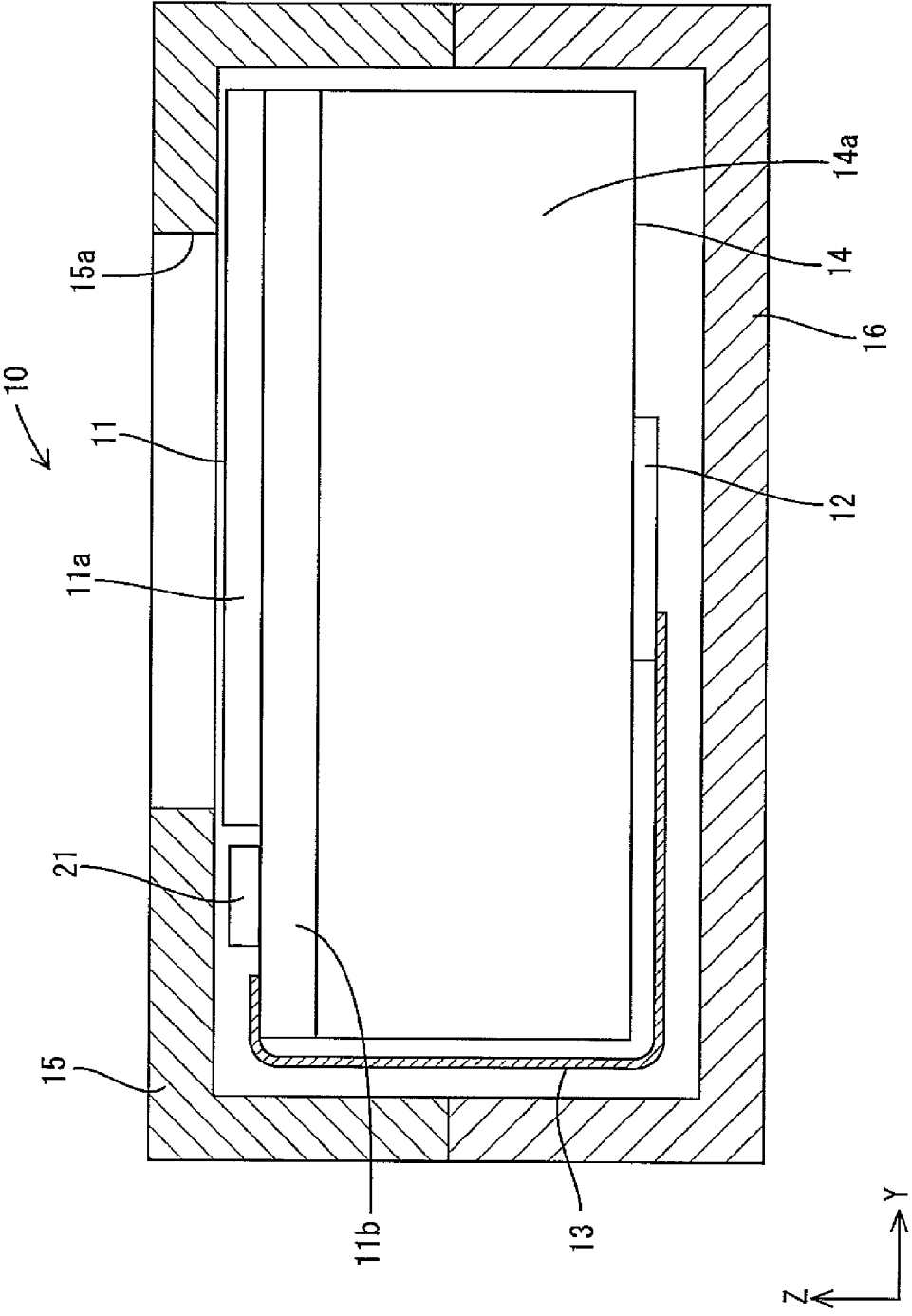
FIG. 2 is a schematic cross-sectional view of a liquid crystal display device illustrating a cross-sectional configuration along a long-side direction thereof.

As illustrated in FIGS. 1 and 2, a liquid crystal display device 10 includes a liquid crystal panel (a display device) 11, a driver (a panel driver) 21, a control circuit board (an external signal source) 12, a flexible printed circuit board 13, and a backlight unit (a backlight device) 14. The liquid crystal panel 11 includes a display area AA in which images are displayed and a non-display area NAA outside the display area AA. The driver 21 is configured to drive the liquid crystal panel 11. The control circuit board 12 is configured to supply various input signals to the driver 21 from the outside. The flexible printed circuit board 13 electrically connects the liquid crystal panel 11 to the control circuit board 12 outside the liquid crystal panel 11. The backlight unit 14 is an external light source that supplies light to the liquid crystal panel 11. The liquid crystal display device 10 further includes a pair of exterior components 15 and 16 that are front and rear components used in a pair to hold the liquid crystal panel 11 and the backlight unit 14 that are attached together. The exterior component 15 on the front has an opening 15a through which imaged displayed in the display area AA of the liquid crystal panel 11 are viewed from the outside. The liquid crystal display device 10 according to this embodiment may be used in various kinds of electronic devices (not illustrated) such as handheld terminals (including electronic books and PDAs), mobile phones (including smartphones), notebook computers (including tablet computers), digital photo frames, portable video game players, and electronic-ink papers. The liquid crystal panel 11 in the liquid crystal display device 10 is in a range between some inches to ten and some inches. Namely, the liquid crystal panel 11 is in a size that is classified as a small or a small-to-medium.

The backlight unit 14 will be described. As illustrated in FIG. 2, the backlight unit 14 includes a chassis 14a, light sources (e.g., cold cathode fluorescent tubes, LEDs, organic ELs), an optical member. The chassis 14a has a box-like shape with an opening on the front (on a liquid crystal panel 11 side). The light sources, which are not illustrated, are disposed inside the chassis 14a. The optical member, which is not illustrated, is arranged so as to cover the opening of the chassis 14a. The optical member has a function to convert light from the light sources into planar light.

Next, the liquid crystal panel 11 will be described. As illustrated in FIG. 1, the liquid crystal panel 11 has a vertically-long rectangular overall shape. The liquid crystal panel 11 includes a display area (an active area) AA that is off centered toward one of ends of a long dimension thereof (the upper side in FIG. 1). The driver 21 and the flexible printed circuit board 13 are arranged at the other end of the long dimension of the liquid crystal panel 11 (the lower side in FIG. 1). An area of the liquid crystal panel 11 outside the display area AA is a non-display area (non-active area) NAA in which images are not displayed. The non-display area NAA includes a frame-shaped area around the display area AA (a frame portion of a CF board 11a, which will be described later) and an area provided at the other end of the long dimension of the liquid crystal panel 11 (an exposed area of an array board 11b which does not overlap the CF board 11a, which will be described later). The area provided at the other end of the long dimension of the liquid crystal panel 11 includes amounting area (an attachment area) in which the driver 21 and the flexible printed circuit board 13 are mounted. A short-side direction and a long-side direction of the liquid crystal panel 11 correspond to the X-axis direction and the Y-axis direction in each drawing. In FIG. 1, a chain line box slightly smaller than the CF board 11a indicates a boundary of the display area AA. An area outside the solid line is the non-display area NAA.

Next, the components connected to the liquid crystal panel 11 will be described. As illustrated in FIGS. 1 and 2, the control circuit board 12 is mounted to the back surface of the chassis 14a (an outer surface on a side opposite from the liquid crystal panel 11) of the backlight unit 14 with screws. The control circuit board 12 includes a substrate made of paper phenol or glass epoxy resin and electronic components mounted on the substrate and configured to supply various input signals to the driver 21. Traces (electrically conductive paths) which are not illustrated are formed in predetermined patterns. An end of the flexible printed circuit board 13 is electrically and mechanically connected to the control circuit board 12 via an anisotropic conductive film (ACF), which is not illustrated.

The flexible printed circuit board (an FPC board) 13 includes a base member made of synthetic resin having insulating property and flexibility (e.g., polyimide resin). A number of traces are formed on the base member (not illustrated). As illustrated in FIG. 2, the end of the long dimension of the flexible printed circuit board 13 is connected to the control circuit board 12 disposed on the back surface of the chassis 14a as described above. The other end of the long dimension of the flexible printed circuit board 13 is connected to the array board 11b in the liquid crystal panel 11. The flexible printed circuit board 13 is bent or folded back inside the liquid crystal display device 10 such that a cross-sectional shape thereof forms a U-like shape. At the ends of the long dimension of the flexible printed circuit board 13, portions of the traces are exposed to the outside and configured as terminals (not illustrated). The terminals are electrically connected to the control circuit board 12 and the liquid crystal panel 11. With this configuration, input singles supplied by the control circuit board 12 are transmitted to the liquid crystal panel 11.

As illustrated in FIG. 1, the driver 21 is an LSI chip including drive circuits. The driver 21 is configured to operate according to signals supplied by the control circuit board 12, which is a signal source, to process the input signal supplied by the control circuit board 12, to generate output signals, and to output the output signals to the display area AA in the liquid crystal panel 11. The driver 21 has a vertically-long rectangular shape (an elongated shape that extends along the short side of the liquid crystal panel 11) in a plan view. The driver 21 is directly connected to the non-display area NAA of the liquid crystal panel 11 (or the array board 11b, which will be described later), that is, mounted by the chip-on-glass (COG) mounting method. A long-side direction and a short-side direction of the driver 21 correspond to the X-axis direction (the short-side direction of the liquid crystal panel 11) and the Y-axis direction (the long-side direction of the liquid crystal panel 11), respectively.

Figure 3:
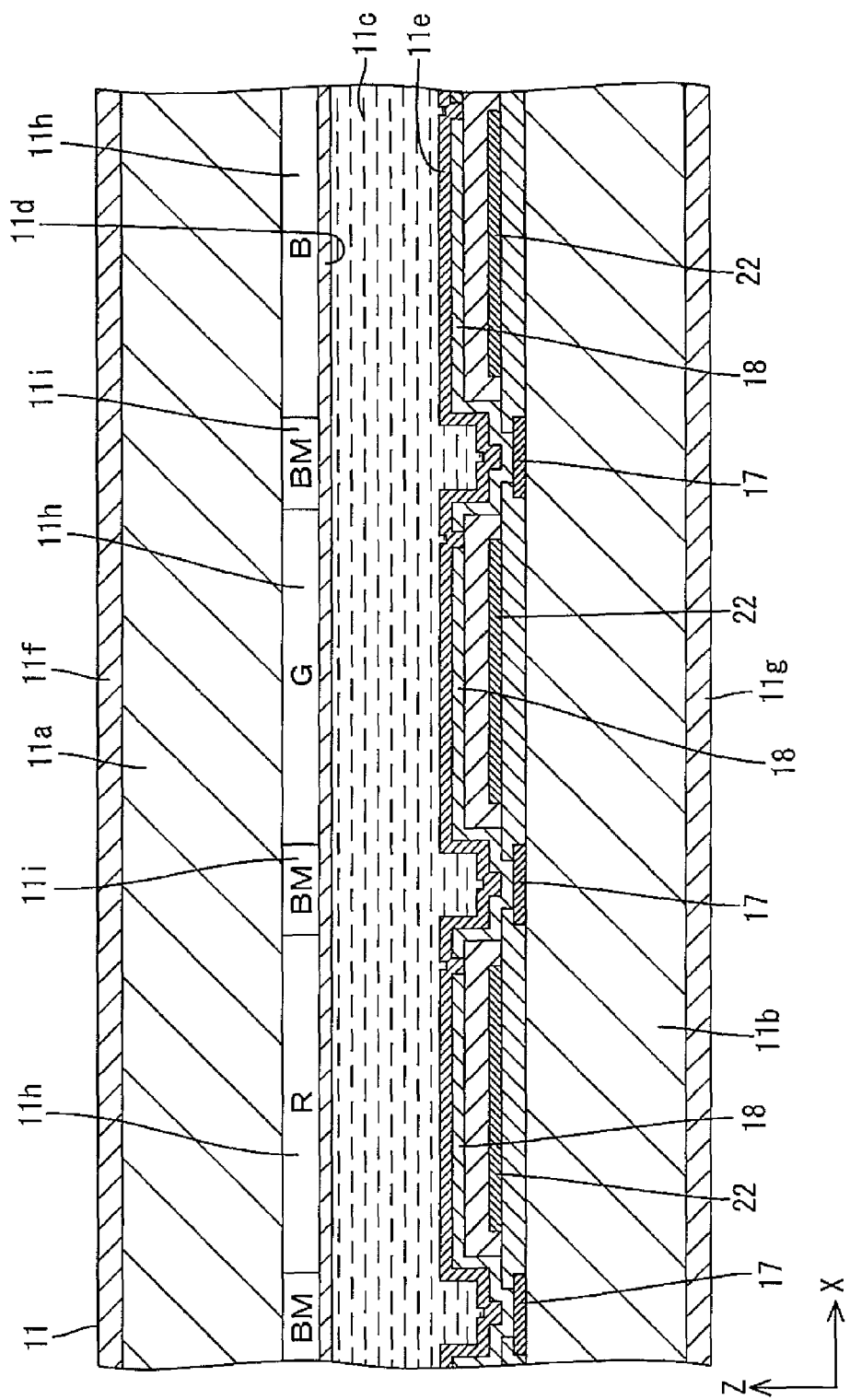
FIG. 3 is a schematic cross-sectional view illustrating a cross-sectional configuration of the liquid crystal panel.

The liquid crystal panel 11 will be described in more detail. As illustrated in FIG. 3, the liquid crystal panel 11 includes a pair of substrates 11a and 11b and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a gap therebetween. A size of the gap corresponds to the thickness of the liquid crystal layer 11c. The liquid crystal panel 11 according to this embodiment operates in fringe field switching (FFS) mode that is a mode improved from an in-plane switching (IPS) mode. On one of the substrates 11a and 11b, specifically, on the array board 11b, pixel electrodes (second transparent electrodes) 18 and common electrodes (first transparent electrodes) 22, which will be described later, are formed. The pixel electrodes 18 and the common electrodes 22 are formed in different layers. One of the substrates 11a and 11b on the front is the CF board (a common substrate) 11a and one on the rear (on the back) is the array board (a semiconductor device) 11b. The CF board 11a and the array board 11b includes glass substrates GS that are substantially transparent (i.e., having high light transmissivity). Various films are formed in layers on each glass substrate GS. As illustrated in FIGS. 1 and 2, the CF board 11a has a short dimension substantially equal to that of the array board 11b and a long dimension smaller than that of the array board 11b. The CF board 11a is bonded to the array board 11b with one of ends of the long dimension (the upper end in FIG. 1) aligned with a corresponding edge of the array board 11b. A predetermined area of the other end of the long dimension of the array board 11b (the lower end in FIG. 1) does not overlap the CF board 11a and front and back plate surfaces of the area are exposed to the outside. The mounting area in which the driver 21 and the flexible printed circuit board 13 are mounted is provided in this area. Alignment films 11d and 11e are formed in inner surfaces of the substrates 11a and 11b, respectively, for alignment of the liquid crystal molecules included in the liquid crystal layer 11c. Polarizing plates 11f and 11g are attached to outer surfaces of the substrates 11a and 11b, respectively.

Figure 7:
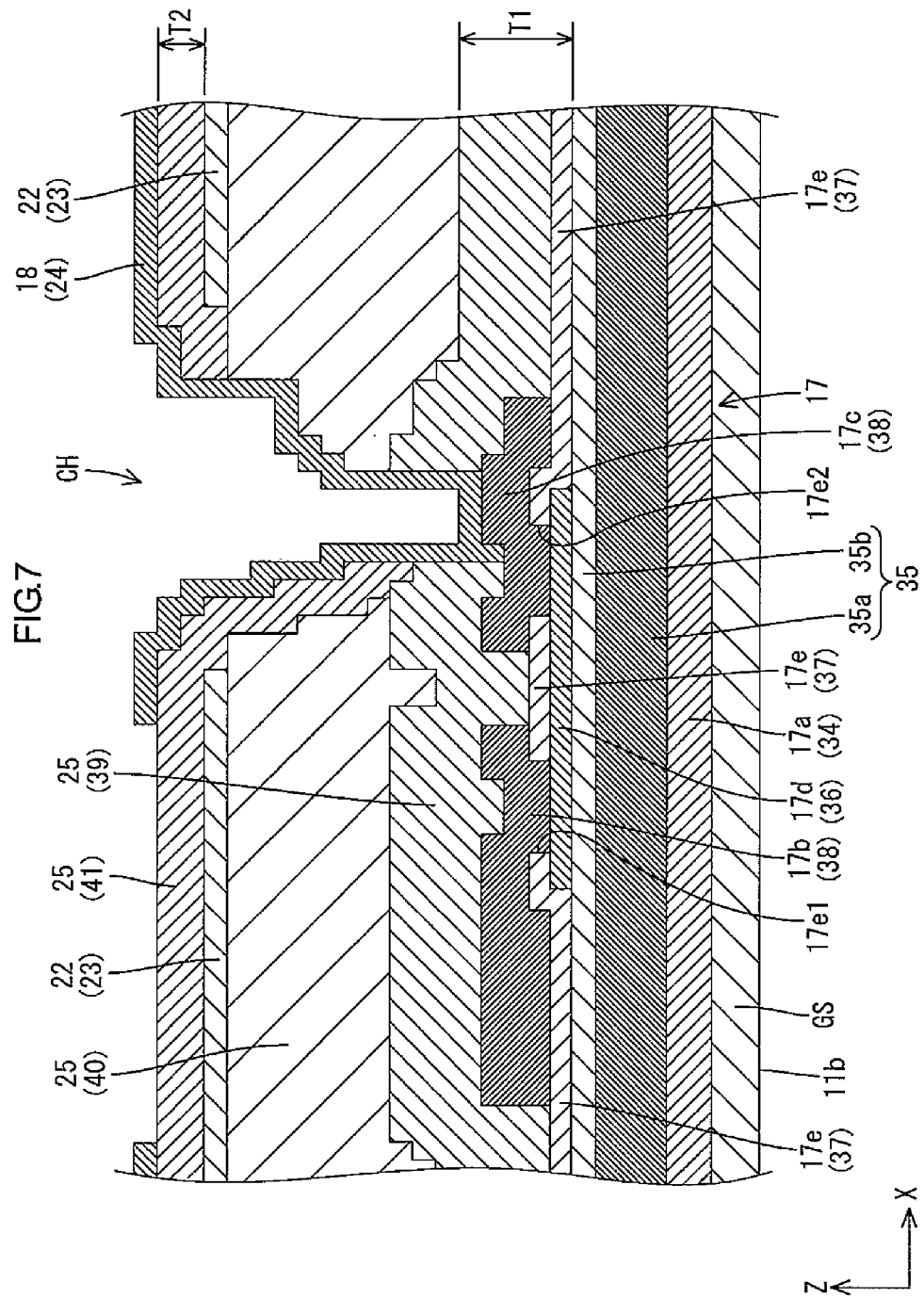
FIG. 7 is a cross-sectional view of FIG. 6 along line vii-vii.

The films formed in layers on the inner surface of the array board 11b (on the liquid crystal layer 11c side, a surface opposite the CF board 11a) by a known photolithography method will be described. As illustrated in FIG. 7, on the array board 11b, the following films are formed in the following order from the lowest layer (the grass substrate GS): a first metal film (a gate metal film) 34, a gate insulator (a first insulation film) 35, a semiconductor film 36, a protection film 37, a second metal film (a source metal film) 38, a first interlayer insulator (a second insulation film) 39, an organic insulation film 40, a first transparent electrode film 23, a second interlayer insulator (a third insulation film) 41, and a second transparent electrode film 24.

The first metal film 34 is a layered film of titanium (Ti) and copper (Cu). The gate insulator 35 includes a lower gate insulator (a lower first insulating film) 35a that contains silicon nitride (SiNx) and an upper gate insulator (an upper first insulating film) 35b that contains of silicon oxide (SiO2). The semiconductor film 36 is an oxide thin film that is a kind of oxide semiconductors containing indium (In), gallium (Ga), and zinc (Zn). The oxide semiconductor that contains indium (In), gallium (Ga), and zinc (Zn), that is, the semiconductor film 36 may be amorphous or crystalline. In the display area AA, the semiconductor film 36 forms a first channel of a display area TFT 17, which will be described later. In the non-display area NAA, the semiconductor film 36 forms a second channel 29d of a non-display area TFT 29, which will be described later. The protection film 37 contains silicon oxide (SiO2).

The second metal film 38 is a layered film that contains titanium (Ti) and copper (Cu). The first interlayer insulation film 39 contains silicon oxide (SiO2). The organic insulation film 40 contains acrylic resin (e.g., polymethyl methacrylate (PMMA)), which is an organic material, and functions as a planarization film. The first transparent electrode film 23 and the second transparent electrode film 24 are made of transparent electrode material such as indium tin oxide (ITO) and zinc oxide (ZnO). The second interlayer insulation film 41 contains silicon nitride (SiNx). A pattern on the second interlayer insulation film 41 in a play view is equal to a pattern on the first interlayer insulation film 39, which will be described in detail later. The first transparent electrode film 23 and the second transparent electrode film 24 among the films are formed only in the display area AA of the array board 11b, that is, are not formed in the non-display area NAA. The insulation films made of insulating materials including the gate insulator 35, the protection film 37, the first interlayer insulation film 39, and the second interlayer insulation film 41 (the insulation films except for the organic insulation film 40) are formed in solid patterns (although openings are formed in some areas) arranged in a whole area of the surface of the array board 11b. The first metal film 34, the semiconductor film 36, and the second metal film 38 are formed in predetermined patterns in the display area AA and the non-display area NAA of the array board 11b.

Figure 5:
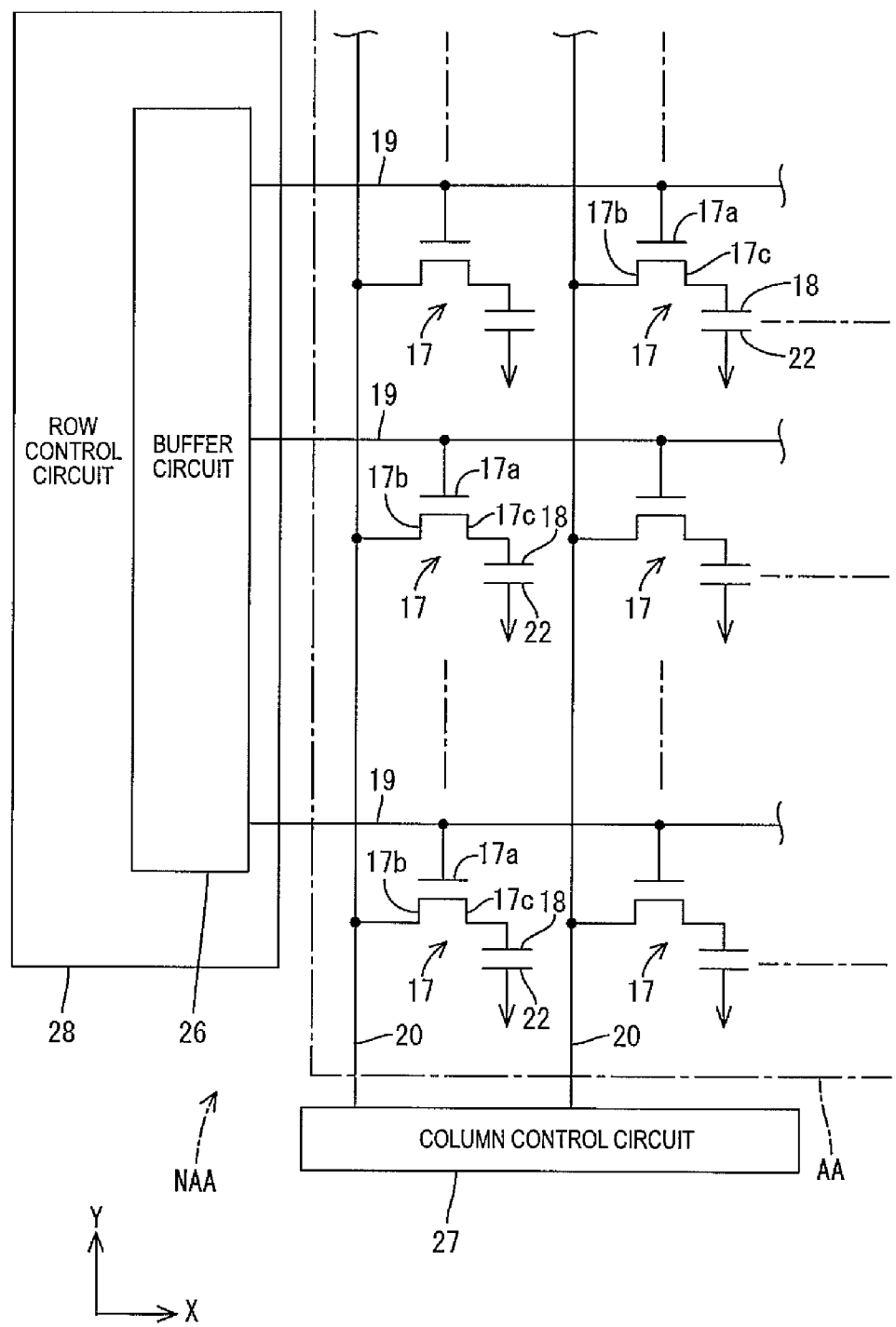
FIG. 5 is a plan view illustrating a wiring layout of display area TFTs.
Figure 6:
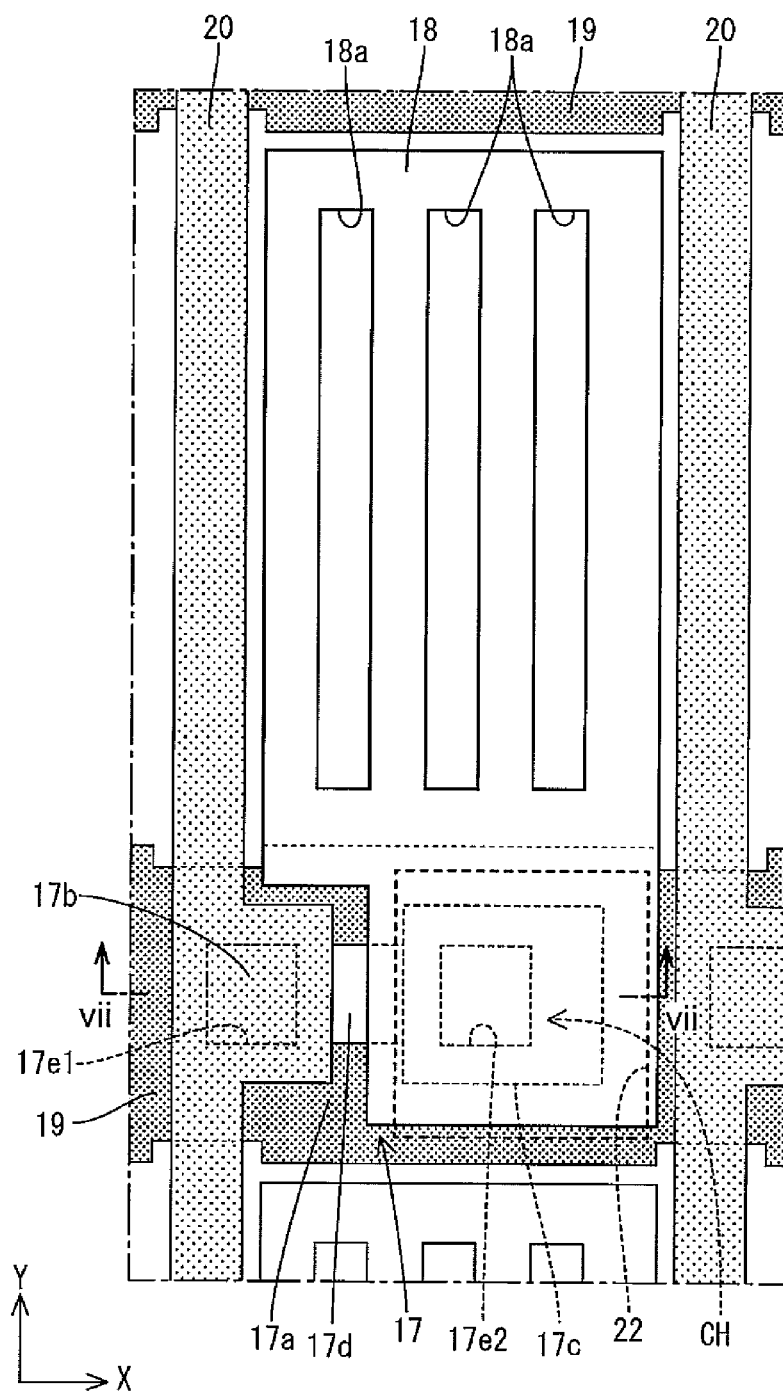
FIG. 6 is a plan view illustrating a planar configuration of a pixel in a display area.

Next, configurations of components in the display area AA of the array board 11b will be described in sequence. As illustrated in FIGS. 5 and 6, in the display area AA of the array board 11b, display area TFTs (display area transistors) 17, which are switching components, and pixel electrodes 18 are disposed in a matrix. Furthermore, gate lines (scanning lines, row control lines) 19 and source lines (column control lines, data lines) 20 are routed in a matrix such that each pair of display area TFT 17 and the pixel electrode 18 is in a cell defined by the gate lines 19 and the source lines 20. Namely, the display area TFTs 17 and the pixel electrodes 18 are arranged in a matrix at respective corners defined by the gate lines 19 and the source lines 20 that are formed in a matrix. The first metal film 34 forms the gate lines 19 and the second metal film 38 forms the source lines 20. The gate insulator 35 and the protection film 37 are arranged between the gate line 19 and the source line 20 at an intersection thereof. Although details will be described later, the gate lines 19 and the source lines 20 are connected to first gate electrodes 17a and first source electrodes 17b of the respective display area TFTs 17, respectively. The pixel electrodes 18 are connected to first drain electrodes 17c of the display area TFTs 17, respectively (FIG. 7). The display area TFTs 17 are arranged on the corresponding gate lines 19 in this embodiment (FIG. 6).

As illustrated in FIG. 7, each display area TFT 17 includes a first electrode 17a, a first channel 17d, a first protection portion 17e, a first source electrode 17b, and a first drain electrode 17c. The first gate electrode 17a is formed from the first metal film 34. The first channel 17d is formed from the semiconductor film 36 and arranged so as to overlap the first gate electrode 17a in a plan view. The first protection portion 17e is formed from the protection film 37. The first protection portion 17e includes two first through holes 17e1 and 17e2 at positions that overlap the first channel 17d in a plan view. The first source electrode 17b is formed from the second metal film 38 and connected to the first channel 17d via one of the first through holes 17e1 and 17e2, specifically the through hole 17e1. The first drain electrode 17c is formed from the second metal film 38 and connected to the first channel 17d via the other one of the first through holes 17e1 and 17e2, specifically the through hole 17e2. The first channel 17d bridges the first source electrode 17b and the first drain electrode 17c so that electrons move between the electrodes 17b and 17c. The semiconductor film 36 that forms the first channel 17d is an oxide thin film that contains indium (In), gallium (Ga), and zinc (Zn). The oxide thin film that contains indium (In), gallium (Ga), and zinc (Zn) has electron mobility higher than that of an amorphous silicon film, for example, 20 to 50 times higher. Therefore, the display area TFTs 17 can be easily downsized and an amount of transmitted light through each pixel electrode 18 can be increased to a maximum level. This configuration is preferable for enhancement of image resolution and reduction of power consumption. Each display area TFT 17 including such an oxide thin film that contains indium (In), gallium (Ga), and zinc (Zn) is an inverted-staggered type having a configuration in which the first gate electrode 17a is arranged at the bottom and the first channel 17d is arranged thereon via the gate insulator 35. A stacking structure of the display area TFT 17 is similar to that of a TFT including a common amorphous silicon thin film.

As illustrated in FIGS. 6 and 7, each pixel electrode 18 is formed from the second transparent electrode film 24. The pixel electrode 18 has a vertically-long rectangular overall shape in a plan view and arranged in an area defined by the gate lines 19 and the source lines 20. The pixel electrode 18 includes longitudinal slits 18a (three of them in FIG. 6) which form a comb-shaped portion. The pixel electrode 18 is formed on the second interlayer insulation film 41. The second interlayer insulation film 41 is between the pixel electrode 18 and a common electrode 22, which will be described later. Under the pixel electrode 18, a first insulation layer 25 is arranged. The first insulation layer 25 includes the first interlayer insulation film 39, the organic insulation film 40, the second interlayer insulation film 41, and a contact hole CH that is a through hole formed at a position that overlaps the first drain electrode 17c in a plan view. The pixel electrode 18 is connected to the first drain electrode 17c of the display area TFT 17 via the contact hole CH. When a voltage is applied to the first gate electrode 17a of the display area TFT 17, electrical conduction via the first channel 17d occurs between the first source electrode 17b and the first drain electrode 17c. As a result, a predetermined potential is applied to the pixel electrode 18. The contact hole CH is formed during formation of the second interlayer insulation film 41. A pattern including an opening is transferred onto the second interlayer insulation film 41 using a mask and the first interlayer insulation film 39 and the organic insulation film 40 are etched using the second interlayer insulation film 41 including the opening as a resist. As a result, holes that continue to the hole of the second interlayer insulation film 41 are formed in the first interlayer insulation film 39 and the organic insulation film 40. The common electrode 22 is formed from the first transparent electrode film 23. The common electrode 22 is a solid trace formed in a substantially whole area of the display area AA of the array board 11b. The common electrode 22 is sandwiched between the organic insulation film 40 included in the first insulation layer 25 and the second insulation film 41. A common potential (a reference potential) is applied to the common electrode 22 through a common line, which is not illustrated. By controlling the potential applied to the pixel electrode by the display area TFT 17 as described above, a predetermined potential difference occurs between the electrodes 18 and 22. When a potential difference appears between the electrodes 18 and 22, a fringe field (an oblique field) including a component in a direction normal to a plate surface of the array board 11b is applied to the liquid crystal layer 11c in addition to a component in a direction along the plate surface of the array board 11b because of the slits 18a of the pixel electrode 18. Therefore, not only alignment of the liquid crystal molecules in the slits 18a in the liquid crystal layer 11c but also alignment of the liquid crystal molecules on the pixel electrode 18 is properly switchable. With this configuration, the aperture ratio of a liquid crystal panel 11 improves and a sufficient amount of transmitted light is achieved. Furthermore, high view-angle performance is achieved. Capacitor lines may be provided (not illustrated). The capacitor lines may extend parallel to the gate lines 19, and may cross and overlap the gate lines 19 via the pixel electrodes 18, and overlap the gate insulator 35, the protection film 37, the first interlayer insulation film 39, the organic insulation film 40, and the second insulation film 41.

Next, configurations of components in the display area AA of the CF board 11a will be described in detail. As illustrated in FIG. 3, the CF board 11a includes color filters 11h including red (R), green (G), and blue (B) color portions arranged in a matrix so as to overlap the pixel electrodes 18 on the array board 11b in a plan view. A light blocking layer (a black matrix) 11i is formed in a grid for colors from mixing. Each line of the grid is located between the adjacent color portions of the color filters 11h. The light blocking layer 11i is arranged over the gate lines 19 and the source lines 20 in a plan view. An alignment film 11d is formed on the surfaces of the color filters 11h and the light blocking layer 11i. Each display pixel of the liquid crystal panel 11 includes three color portions, that is, R, G and B color portions and three pixel electrodes 18 opposite the color portions, respectively. The display pixel includes a red pixel including the R color portion, a green pixel including the G color portion, and a blue pixel including the B color portion. The pixels are arranged on the plate surface of the liquid crystal panel 11 in repeated sequence along the row direction (the X-axis direction) and form groups of pixels. The groups of pixels are arranged along the column direction (the Y-axis direction).

Figure 4:
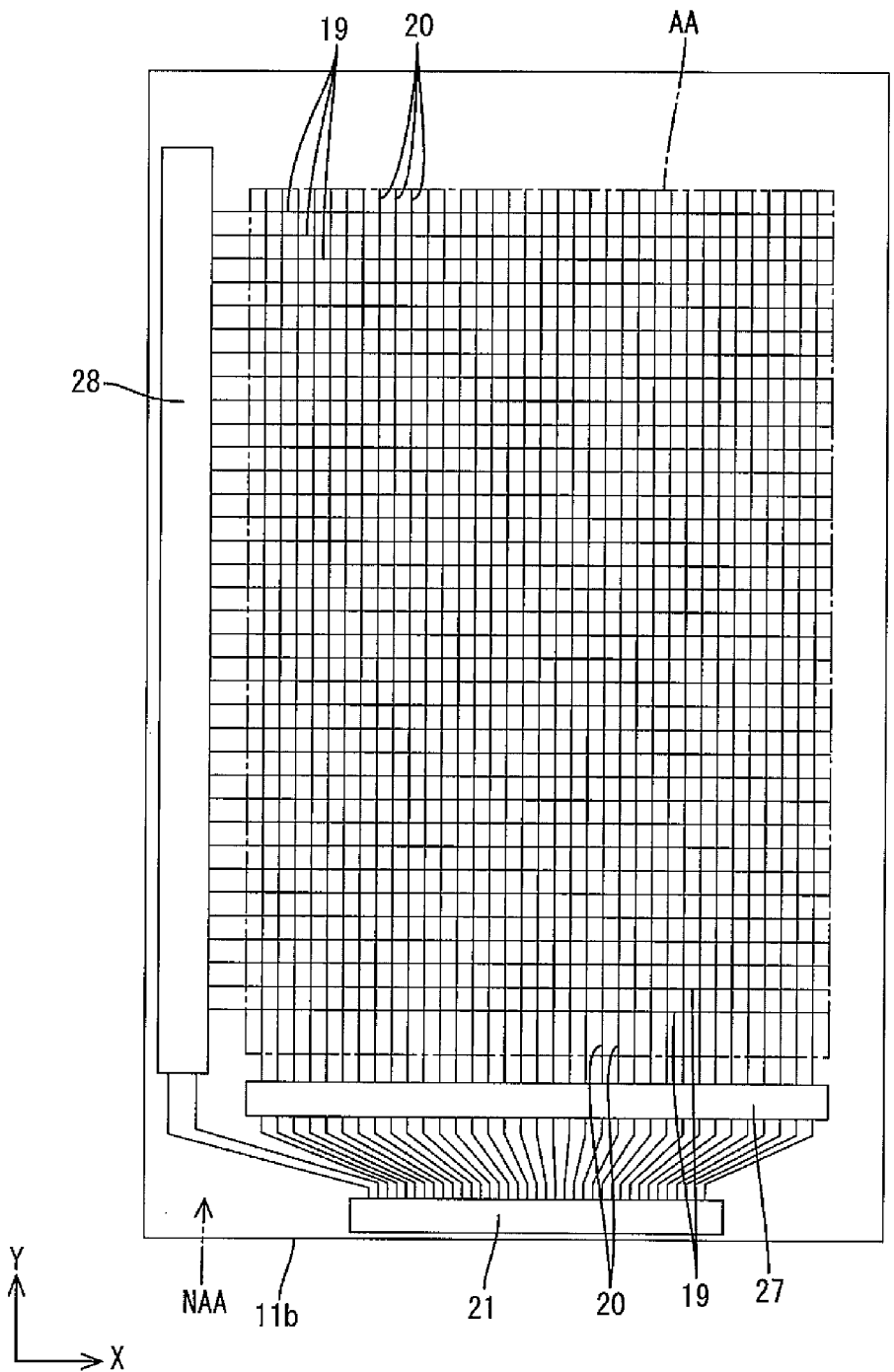
FIG. 4 is a plan view schematically illustrating a wiring layout of an array board included in the liquid crystal panel.

Next, configurations of components in the non-display area NAA of the array board 11b will be described in detail. As illustrated in FIG. 4, a column control circuit 27 is disposed in a portion of the non-display area NAA of the array board 11b adjacent to the short edge of the display area AA. A row control circuit 28 is disposed in a portion of the non-display area NAA adjacent to the long edge of the display area AA. The column control circuit 27 and the row control circuit 28 are configured to perform control for supplying output signals from the driver 21 to the display area TFTs 17. The column control circuit 27 and the row control circuit 28 are monolithically fabricated on the array board 11b. The column control circuit 27 and the row control circuit 28 include an oxide thin film (the semiconductor film 36) containing indium (In), gallium (Ga), and zinc (Zn) as in the display area TFTs 17 as a base. The column control circuit 27 and the row control circuit 28 include control circuits configure to perform control for supplying the output signals to the display area TFTs 17. The column control circuit 27 and the row control circuit 28 are formed on the array board 11b by patterning using a known photolithography method at the same time when the display area TFTs 17 are formed by patterning in a fabrication process of the array board 11b.

As illustrated in FIG. 4, the column control circuit 27 is arranged adjacent to the short edge of the display area AA located at the lower side in FIG. 4. Namely, the column control circuit 27 is arranged in a horizontally-long rectangular area along the X-axis direction between the display area AA and the driver 21 with respect to the Y-axis direction. The column control circuit 27 is connected to the source lines 20 in the display area AA. The column control circuit 27 includes switching circuit (RGB switching circuit) configured to sort image signals in the output signals from the driver 21 to the respective source lines 20. The source lines 20 are arranged in the display area AA of the array board 11b along the X-axis direction and parallel to each other. The source lines 20 are connected to the display area TFTs 17 that form R (red), G (green) and B (blue) pixels, respectively. The column control circuit 27 sorts the image signals from the driver 21 using the switching circuit and supplies the sorted signals to the respective R, G, B source lines 20. The column control circuit 27 may include ancillary circuits such as a level-shifter circuit and ESD protection circuit.

As illustrated in FIG. 4, the row control circuit 28 is arranged adjacent to the long edge of the display area AA on the left in FIG. 4 within a vertically-long area that extends in the Y-axis direction. The row control circuit 28 is connected to the gate lines 19 in the display area AA. The row control circuit 28 includes a scanning circuit configured to supply scan signals included in the output signals from the driver 21 to the gate lines 19 at the predetermined timing to scan the gate lines 19 in sequence. The gate lines 19 are arranged in the display area AA of the array board 11b along the Y-axis direction and parallel to each other. The row control circuit 28 supplies control signals (the scan signals) from the driver 21 using the scanning circuit to the gate lines 19 in sequence from the one at the top in FIG. 4 to the one at the bottom to scan the gate lines 19. The row control circuit 28 may include ancillary circuits such as a level-shifter circuit and ESD protection circuit. The column control circuit 27 and the row control circuit 28 are connected to the driver 21 via traces formed on the array board 11b.

As illustrated in FIG. 4, the scanning circuit in the row control circuit 28 includes a buffer circuit 26 connected to the gate lines 19 and configured to output scan signals to the gate lines 19 after amplify the scan signals. The buffer circuit 26 includes non-display area TFTs (non-display area transistors) 29. The non-display area TFTs 29 are arranged in the non-display area NAA of the plate surface of the array board 11b. The non-display area TFTs 29 are formed at the same time when the display area TFTs 17 are formed in the fabrication process of the array board 11b. The non-display area TFTs 29 are for outputting the scan signals at the final stage of signal processing performed by the scanning circuit. Therefore, the current handled by the non-display area TFTs 29 is larger than the current handled by the display area TFTs 17.

Figure 8:
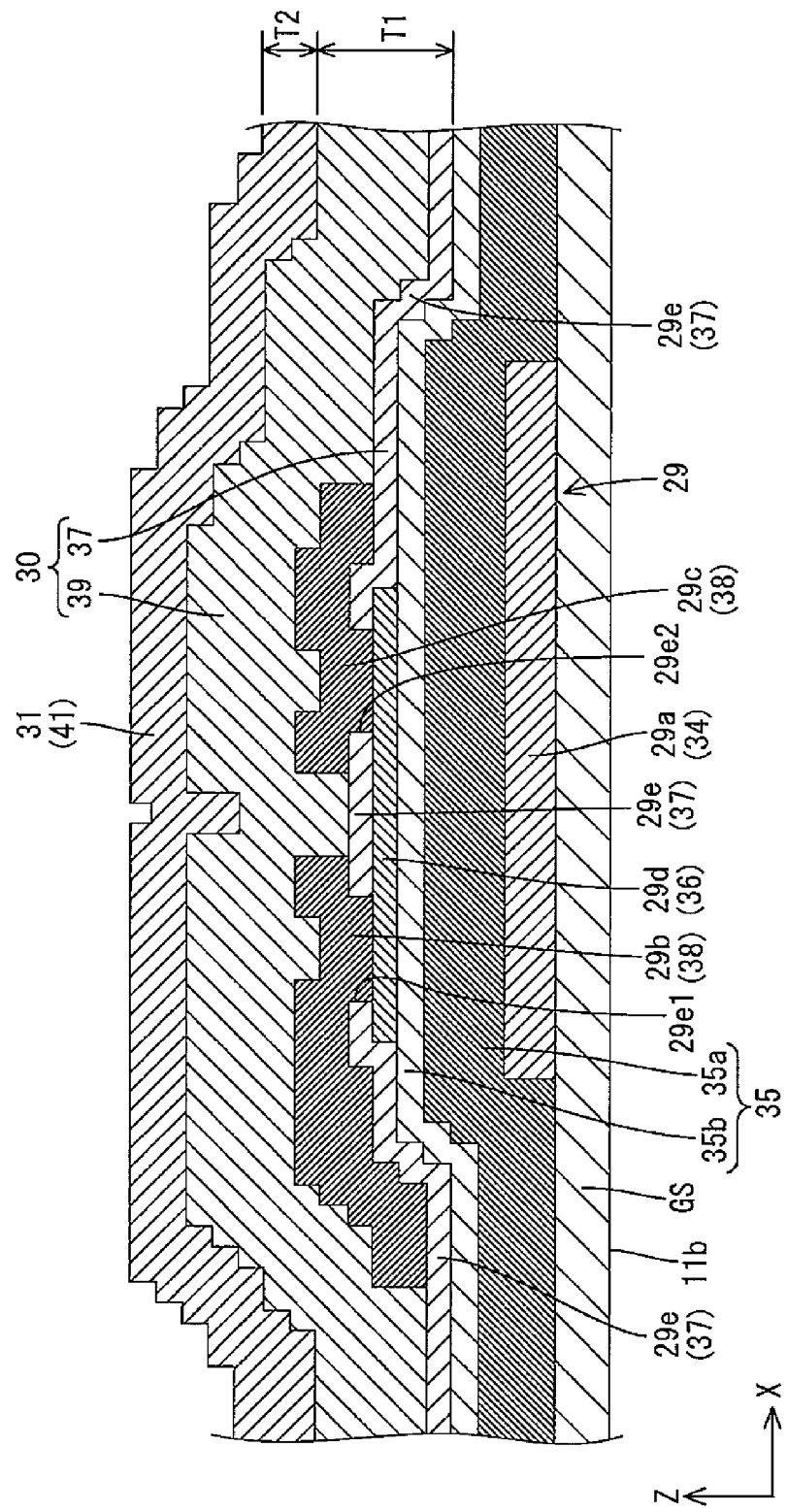
FIG. 8 is a cross-sectional view illustrating a cross-sectional configuration of a non-display area TFT.

A stacking structure of each non-display area TFT 29 will be described. As illustrated in FIG. 8, the non-display area TFT 29 includes a second gate electrode 29a, a second channel 29d, a second protection portion 29e, a second source electrode 29*b*, and a second drain electrode 29*c*. The second gate electrode 29*a* is formed from the first metal film 34. The second channel 29*d* is formed from the semiconductor film 36. The second channel 29*d* is arranged so as to overlap the second gate electrode 29*a* in a plan view. The second protection portion 29*e* is formed from the protection film 37. The second protection portion 29*e* includes two holes 29*e*1 and 29*e*2 that are through holes formed at positions that overlap the second channel 29*d* in a plan view. The second source electrode 29*b* is formed from the second metal film 38. The second source electrode 29*b* is connected to the second channel 29*d* via one of the second holes 29*e*1 and 29*e*2, specifically, the second hole 29*e*1. The second drain electrode 29*c* is formed from the second metal film 39. The second drain electrode 29*c* is connected to the second channel 29*d* via the other one of the holes 29*e*1 and 29*e*2, specifically, the second hole 29*e*2. The second channel 29*d* bridges the second source electrode 29*b* and the second drain electrode 29*c* so that electrons move between the electrodes 29*b* and 29*c*. The semiconductor film 36 that forms the second channel 29*d* is an oxide thin film that contains indium (In), gallium (Ga), and zinc (Zn), which has the same configuration as that of the first channel 17*d* of the display area TFT 17. Similar to the display area TFT, each non-display area TFT 29 is an inverted-staggered type having a configuration in which the second gate electrode 29*a* is arranged at the bottom and the second channel 29*d* is arranged thereon via the gate insulator 35.

As illustrated in FIG. 8, in the upper layer relative to the non-display area TFT 29, a lower insulator 30 and an upper insulator 31 are arranged in this sequence. The lower insulator 30 is formed from the first interlayer insulation film 39 and the protection film 37. The upper insulator 31 is formed from the second interlayer insulation film 41. The organic insulation film 40 is not arranged between the insulators 30 and 31, that is, the organic insulation film 40 is not arranged in the upper layer relative to the non-display area TFT 29. The first interlayer film 39 that forms the lower insulator 30 and the second interlayer film 41 that forms the upper insulator 31 include openings, that is, contact holes CH, respectively, which overlap each other in a plan view in the display area AA (see FIG. 7). The first interlayer film 39 and the second interlayer film 41 are arranged over the non-display area TFT 29 in the non-display area NAA. Patterns of the first interlayer film 39 and the second interlayer film 41 are substantially the same in a plan view. The organic insulation film 40 includes an opening, that is, a contact hole CH in the display area AA. However, the organic insulation film 40 is not arranged over the non-display area TFT 29 in the non-display area NAA. Therefore, patterns of the first interlayer insulation film 39 and the second interlayer insulation film 41 are different in a plan view. The lower insulator 30 has a film thickness larger than that of the upper insulator 31. The film thickness T1 of the lower insulator 30 (including the first interlayer insulation film 39 and the protection film 37) is about two times larger than the film thickness T2 of the upper insulator (the second interlayer film 41). Specifically, the film thickness T2 of the upper insulator 31 is about 100 nm and the film thickness T1 of the lower insulator 30 is about 200 nm. Furthermore, the film thickness of the first interlayer insulation film 39 of the lower insulator 30 is larger than the film thickness of the second interlayer insulation film 41 of the upper insulator 31. As illustrated in FIGS. 7 and 8, the first interlayer insulation film 39 of the first insulator 25 in the display area TFT 17 is larger than the film thickness of the second interlayer insulation film 41 of the first insulator 25 and equal to the film thickness of the first interlayer insulation film 39 of the lower insulator 30 that overlaps the non-display area TFT 29 in a plan view. Therefore, the formation of the first interlayer insulation film 39 completes in a single step in the fabrication process of the array board 11*b*. The second interlayer insulation film 41 of the first insulator 25 in the display area TFT 17 has a film thickness equal to the film thickness T2 of the upper insulator 31 that overlaps the non-display area TFT 29 in a plan view. Regarding "upper" and "lower" of this embodiment, a side closer to the glass substrate GS in the direction perpendicular to the plate surface of the glass substrate GS (the lower side in FIGS. 7 and 8) is referred to as the "lower" and a side away from the glass substrate GS (the upper in FIGS. 7 and 8) is referred to as the "upper." If the non-display area TFT 29 has a configuration in which the organic insulation film 40 is not arranged between the lower insulator 30 and the upper insulator 31, the following problem occurs during the formation of the contact hole CH in the display area TFT 17. If the formation of the contact hole CH is performed by patterning using the organic insulation film 40 as a resist, the first interlayer insulation film 39 of the lower insulator 30 may be etched. The second interlayer insulation film 41 in this embodiment is used as a resist to etch the first interlayer insulation film 39 and the organic insulation film 40 on the lower side during the formation of the contact hole CH in the display area TFT 17. According to this configuration, flexibility in design of patterns related to the organic insulation film 30 increases. Therefore, the non-display area TGT 29 can be configured such that the organic insulation film 40 is not arranged between the lower insulator 30 and the upper insulator 31. Furthermore, the number of masks can be reduced.

According to the above configuration, the following functions and effects are achieved. The acrylic resin used for the organic insulation film 40 is a hygroscopic material. If the semiconductor film 36 absorbs moisture contained in the organic insulation film 40 and degrades, the electrical characteristics of the semiconductor film 36 may change. In the display area TFT 17 arranged in the display area AA of the array board 11*b*, the current that flows between the first source electrode 17*b* and the first drain electrode 17*c* is small. Therefore, even if the first channel 17*d* formed from the semiconductor film 36 degrades due to the moisture in the organic insulation film 40 and the electrical characteristics of the semiconductor film 36 change, operation of the first channel 17*d* is less likely to be affected. However, the current handled by the non-display area TFT 29 is larger than the current handled by the display area TFT 17 because the non-display area TFT 29 is for outputting the scan signals in the final stage of the signal processing performed by the scanning circuit in the row control circuit 28. Namely, if the second channel 29*d* formed from the semiconductor film 36 degrades and the electrical characteristics thereof change, the operation of the second channel 29*d* is more likely to be affected. The semiconductor film 36 is an oxide thin film contacting indium (In), gallium (Ga), and zinc (Zn), which is a kind of oxide semiconductors. The semiconductor film 36 is subject to oxidation or reduction and the electrical characteristics thereof tend to change in response to oxidation or reduction. The degradation of the second channel 29*d* in the non-display area TFT 29 has been an issue. Furthermore, if the second interlayer insulation film 41 is formed in a layer above the organic insulation film 40 that contains moisture, the moisture may be vaporized in a high temperature environment during the film formation. As a result, the second interlayer insulation film 41 becomes porous and tends to absorb moisture from the outside and the semiconductor film 36 may absorb the moisture from the second interlayer insulation film 41.

In this embodiment, the non-display area TFT 29 has the stacking structure without the organic insulation film 40 in the upper layer. Therefore, the second channel 29*d* formed from the semiconductor film 36 is less likely to degrade due to the moisture. If the organic insulation film 40 does not exist, the upper insulator 31 formed from the second interlayer insulation film 41 does not become porous. Therefore, the second channel 29*d* formed from the semiconductor film 36 is less likely to absorb moisture from the outside. Furthermore, the film thickness T1 of the lower insulator 30 formed from the first interlayer insulation film 36 and the protection film 37 is larger than the film thickness T2 of the upper insulator 31 formed from the second interlayer insulation film 41. According to this configuration, during the formation of the second interlayer insulation film 41 (the upper insulator 31) in the fabrication process of the array board 11*b*, the layer below the first interlayer insulation film 39 (the lower insulator 30) is less likely to be damaged. For the formation of the second interlayer insulation film 41, the plasma CVD method is used and the layer below the first interlayer insulation film 39 and the protection film 37 may be damaged. Therefore, it is preferable to set the film thickness T1 of the lower insulator 30 as described above. With this configuration, a malfunction of the non-display area TFT 29 is less likely to occur.

Silicon oxide used for the first interlayer insulation film 39 is less likely to cause oxidation or reduction of the semiconductor film 36 in comparison to silicon nitride or acrylic resin. With the lower insulator 30 having the thickness T1 that is sufficiently large and formed from the first interlayer insulation film 39, the electrical characteristics of the second channel 29*d* formed from the semiconductor film 36 are less likely to change. Furthermore, silicon nitride used for the second interlayer insulation film 41 is more likely to include hydrogen during the film formation in comparison to silicon oxide and thus reduction of the semiconductor film 36 may be caused by hydrogen. With the lower insulator 30 having the thickness sufficiently large and formed from the first interlayer insulation film 39, reduction of the second channel 29*d* formed from the semiconductor film 36 due to hydrogen contained in the second interlayer insulation film 41 is less likely to occur. Therefore, the electrical characteristics of the second channel 29*d* are less likely to change. The protection film 37 arranged above the semiconductor film 36 and the upper gate insulator 35*b* of the gate insulator 35 arranged below the semiconductor film 36 are made of silicon oxide. Therefore, oxidation or reduction of the semiconductor film 36 is less likely to occur and thus the electrical characteristics of the second channel 29*d* formed from the semiconductor film 36 are further less likely to change.

As described above, the array board (a semiconductor device) 11*b* according to this embodiment includes the glass substrate (a substrate) GS, the first metal film 34, the gate insulator (a first insulation film) 35, the semiconductor film 36, the second metal film 38, the first interlayer insulation film (a second insulation film) 39, the organic insulation film 40, the first transparent electrode film 23, the second interlayer insulation film (a third insulation film) 41, the second transparent electrode film 24, the display area AA, the display area TFTs (display area transistors) 17, the common electrodes (a first transparent electrode) 22, the first insulator 25, the pixel electrodes (a second transparent electrode) 18, the non-display area NAA, the non-display area TFTs (a non-display area transistor) 29, the upper insulator 31, and the lower insulator 30. The first metal film 34 is formed on the glass substrate GS. The gate insulator 35 is formed on at least the first metal film 34. The semiconductor film 36 is formed on the gate insulator 35. The second metal film 38 is formed on at least the semiconductor film 35. The first interlayer insulation film 39 is formed on at least the second metal film 38. The organic insulation film 40 is formed on the first interlayer insulation film 39. The first transparent electrode film 23 is formed on the organic insulation film 40. The second interlayer insulation film 41 is formed on at least the first transparent electrode film 23. The second transparent electrode film 24 is formed on at least the second interlayer insulation film 41. The display area AA is configured such that images are displayed on the plate surface of the glass substrate GS. Each display area TFT 17 is arranged in the display area AA and includes at least the first gate electrode 17*a*, the first channel 17*d*, the first source electrode 17*b*, and the first drain electrode 17*c*. The first gate electrode 17*a* is formed from the first metal film 34. The first channel 17*d* is formed from the semiconductor film 36 and arranged so as to overlap the first gate electrode 17*a* in a plan view. The first source electrode 17*b* is formed from the second metal film 38 and connected to the first channel 17*d*. The first drain electrode 17*c* is formed from the second metal film 38 and connected to the first channel 17*d*. Each common electrode 22 is arranged in the display area AA and formed from the first transparent electrode film 23. The first insulator 25 is arranged in the display area AA and formed from the first interlayer insulation film 39, the organic insulation film 40, and the second interlayer insulation film 41. The first insulator 25 includes the contact hole CH that is a through hole formed at the position that overlaps the first drain electrode 17*c* in a plan view. Each pixel electrode 18 is arranged in the display area AA and formed from the second transparent electrode film 24. The pixel electrode 18 is connected to the first drain electrode 17*c* via the contact hole CH. The non-display area NAA is located outside the display area AA on the plate surface of the glass substrate GS. Each non-display area TFT 29 is arranged in the non-display area NAA and includes at least the second gate electrode 29*a*, the second channel 29*d*, the second source electrode 29*b*, and the second drain electrode 29*c*. The second gate electrode 29*a* is formed from the first metal film 34. The second channel 29*d* is formed from the semiconductor film 36 and arranged so as to overlap the second gate electrode 29*a* in a plan view. The second source electrode 29*b* is formed from the second metal film 38 and connected to the second channel 29*d*. The second drain electrode 29*c* is formed from the second metal film 38 and connected to the second channel 29*d*. The upper insulator 31 is arranged in the non-display area NAA and formed from the second interlayer insulation film 41. The lower insulator 30 is arranged in the non-display area NAA under the upper insulator 31 and formed from at least the first interlayer insulation film 39.

According to this configuration, when voltages are applied to the first gate electrodes 17*a* of the display area TFTs 17 in the display area AA of the plate surface of the glass substrate GS, a current starts flowing between each first source electrode 17*b* and the corresponding first drain electrode 17*c* via the corresponding first channel 17*d*. As a result, the pixel electrodes 18 connected to the first respective drain electrodes 17*c* are charged and images are displayed in the display area AA according to a potential difference between each pixel electrode 18 and the corresponding common electrode 22.

A hygroscopic material is often used for the organic insulation film 40. If the semiconductor film 36 absorbs the moisture contained in the organic insulation film 40 and degrades, the electrical characteristics of the semiconductor film 36 may change. The current that flows between the first source electrode 17*b* and the first drain electrode 17*c* of each display area TFT 17 is small. Therefore, even if each first channel 17*d* formed form the semiconductor film 36 degrades and the electrical characteristics thereof changes, the operation of the display area TFT 17 is less likely to be subject to adverse effect. However, the current that flows between some second source electrode 28b and the corresponding second drain electrode 29c of the non-display area TFT 29 may become large. When the second channel 29d formed from the semiconductor film 36 of such a non-display area TFT 29 degrades and the electrical characteristics thereof change, the operation of the non-display area TFT 29 is more likely to be subject to adverse effect.

In each non-display area TFT 29 described above, the organic insulation film 40 is not arranged between the upper insulator 31 formed from the second interlayer insulation film 41 and the lower insulator 30 formed from at least first interlayer insulation film 39. Therefore, the second channel 29d formed form the semiconductor film 36 is less likely to degrade and thus electrical characteristics of second channel 29d are less likely to chance. Malfunctions of the non-display area TFTs 29 are less likely to occur.

The thickness T1 of the lower insulator 30 is larger than the upper insulator 31. Because the thickness T1 of the lower insulator 30 is larger than the thickness T2 of the upper insulator 31, the layer below the first interlayer insulation film 39 (the lower insulator 30) is less likely to be damaged during the formation of the second interlayer insulation film 41 (the lower insulator 31) in the fabrication process of the array board 11b.

The protection film 37 is formed at least between the semiconductor film 36 and the second metal film 38 to protect the semiconductor film 36. Each display area TFT 17 includes the first protection portion 17e formed from the protection film 37. The first protection portion 17e includes two first through holes 17e1 and 17e2 at the positions that overlap the first channel 17d in a plan view. The first source electrode 17b is connected to the first channel 17d via one of the first through holes 17e1 and 17e2. The first drain electrode 17c is connected to the first channel 17d via the other one of the first through holes 17e1 and 17e2. Each non-display area TFT 29 includes the second protection portion 29e formed from the protection film 37. The second protection portion 29e includes two second through holes 29e1 and 29e2 at the positions that overlap the second channel 29d in a play view. The second source electrode 29b is connected to the second channel 29d via one of the second through holes 29e1 and 29e2. The second drain electrode 29c is connected to the second channel 29d via the other one of the second through holes 29e1 and 29e2. The lower insulator 30 is formed from the second insulation film 39 and the protection film 37. According to the configuration, the semiconductor film 36 is protected by the protection film 37 arranged between the semiconductor film 36 and the second metal film 38. During the formation of the second metal film 38 in the fabrication process, the first channel 17d and the second channel 29d are less likely to be etched. Furthermore, the lower insulator 30 is formed from the first interlayer insulation film 39 and the protection film 37. Therefore, the layer below the first interlayer insulation film 39 and the protection film 37 is less likely to be damaged during the formation of the second interlayer insulation film 40 in the fabrication process of the array board 11b. The first protection portion 17e formed from the protection film 37 includes two first through holes 17e1 and 17e2. The first source electrode 17b and the first drain electrode 17c are connected to the first channel 17d via the first through holes 17e1 and 17e2, respectively. The second protection portion 29e formed from the protection film 37 includes two second through holes 29e1 and 29e2. The second source electrode 29b and the second drain electrode 29c are connected to the second channel 29d via the second through holes 29e1 and 29e2, respectively.

The protection film 37 is made of silicon oxide. The silicon oxide is less likely to cause oxidation or reduction of the semiconductor film 36 in comparison to silicon nitride or an organic insulation material. In each display area TFT 17 and each non-display area TFT 29, the protection film 37 is arranged above the semiconductor film 36 to protect the semiconductor film 36. With the protection film 37 made of silicon oxide, the electrical characteristics of the first channel 17d and the second channel 29d formed from the semiconductor film 36 are less likely to change.

Each display area TFT 17 includes the first interlayer insulation film 39, the thickness of which is larger than the thickness T2 of the second interlayer insulation film 41 and equal to the thickness of the first interlayer insulation film 39 of the non-display area TFT 29. The first interlayer insulation film 39 of the display area TFT 17 is a component of the first insulator 25. The second interlayer insulation film 41 of the display area TFT 17 is a component of the first insulator 25. The first interlayer insulation film 39 of the non-display area TFT 29 is a component of the lower insulator 30. The first interlayer insulation film 39 in the display area AA and the first interlayer insulation film 39 in the non-display area NAA are formed with the same thickness, that is, they can be formed in the same film formation process. According to this configuration, the tact time can be reduced.

The second interlayer insulation film 41 is made of silicon nitride. The silicon nitride is more likely to include hydrogen during the formation of film in comparison to the silicon oxide. The reduction of the semiconductor film 36 is more likely to occur due to the hydrogen. However, in the non-display area TFT 29, the thickness T1 of the lower insulator 30 formed at least from the first interlayer insulation film 39 is larger than the thickness T2 of the upper insulator 31 and thus the reduction of the second channel 29d formed from the semiconductor film 36 is less likely to occur. Therefore, the electrical characteristics of the second channel 29d are less likely to change.

The organic insulation film 40 is made of acrylic resin. The acrylic resin is a hygroscopic material and thus the semiconductor film 36 may degrade due to the moisture therefrom. However, in each non-display area TFT 29, the thickness T1 of the lower insulator 30 formed at least from the first interlayer film 39 is larger than the thickness T2 of the upper insulator 31 formed from the second interlayer film 41 and thus the second channel 29d formed from the semiconductor film 36 is less likely to degrade. Therefore, the electrical characteristics of the second channel 29d are less likely to change.

The semiconductor film 36 is made of oxide semiconductor. Although the oxide semiconductor tends to be subject to oxidation or reduction, each non-display area TFT 29 has the configuration that does not include the organic insulation film 40 and thus the second channel 29d formed from the semiconductor film 36 is less likely to degrade. Therefore, the electrical characteristics of the second channel 29d are less likely to change. The semiconductor film 36, which is made of oxide semiconductor, is more likely to be etched during the formation of the second metal film 38 in the fabrication process. However, the protection film 37 is arranged between the semiconductor film 36 and the second metal film 38 and the semiconductor film 36 is protected by the protection film 37. Therefore, the semiconductor film 36 is less likely to be etched during the formation of the second metal film 38.

The gate lines (scan signal lines) 19 are arranged in the display area AA. The gate lines are connected to the first gate electrodes 17a to transmit the scan signals to the display area TFTs 17. The buffer circuit 26 is arranged in the non-display area NAA. The buffer circuit 26 is connected to the gate lines 19 and configured to supply the scan signals to the gate lines 19. The non-display area TFTs 29 are components of the buffer circuit 26. According to this configuration, the current that flows between the second source electrode 29b and the second drain electrode 29c in each non-display area TFT 29, which is a component of the buffer circuit 26, tends to be larger than the current that flows between the first source electrode 17b and the first drain electrode 17c in each display area TFT 17. If the semiconductor film 36 that forms the second channel 29d of the non-display area TFT 29 degrades due to moisture from other films or the outside and the electrical characteristics of the semiconductor film 36 changes, the non-display area TFT 29 may not properly operate. Because the non-display area TFT 29 does not include the organic insulation film 40 as described above, the second channel 29d is less likely to degrade. Therefore, a malfunction of the non-display area TFT, which is a component of the buffer circuit 26, is less likely to occur.

The first interlayer insulation film 39 is made of silicon oxide. In comparison to silicon nitride or an organic insulation material, the silicon oxide is a material that is less likely to cause oxidation or reduction of the semiconductor film 36. The first interlayer insulation film 39 of each non-display area TFT 29, which forms the lower insulator 30, is made of silicon oxide. Therefore, the electrical characteristics of the second channel 29d formed from the semiconductor film 36 are further less likely to change.

The gate insulator 35 has the stacking structure in which the lower gate insulator (a lower first insulation film) 35a and the upper gate insulator (an upper first insulation film) 35b are stacked. The lower gate insulator 35a is made of silicon nitride. The upper gate insulator 35b is made of silicon oxide and arranged between the lower gate insulator 35a and the semiconductor film 36. In comparison to silicon nitride or an organic insulation material, the silicon oxide is less likely to cause oxidation of reduction of the semiconductor film 36. The upper gate insulator 35b arranged between the lower gate insulators 35a and the semiconductor films 36 in each display area TFT 17 and each non-display area TFT 29 are made of silicon oxide. Therefore, the electrical characteristics of the first channel 17d and the second channel 29d formed from the semiconductor films 36 are less likely to change.

The patterns of the first interlayer film 39 and the second interlayer film 41 in a plan view are the same in the display area AA and the non-display area NAA for the entire areas thereof. According to this configuration, the first interlayer insulation film 39 can be patterned using the second interlayer insulation film 41 as a resist after the second interlayer insulation film 41 is formed and patterned. According to this configuration, a mask is not required for patterning of the first interlayer insulation film 39 and thus a fabrication facility can be simplified and a fabrication cost can be reduced. Furthermore, the organic insulation film 40 is not used as a resist during the patterning of the first interlayer insulation film 39. Because flexibility in design of the pattern of the organic insulation film 40 increases, the non-display area NAA can be configured such that the organic insulation film 40 is not arranged between the upper insulator 31, which is formed from the second interlayer film 41, and the lower insulator 30, which is formed from at least the first interlayer insulation film 39.

The liquid crystal panel (a display device) 11 according to this embodiment includes the array board 11b described above, the CF board (a counter substrate) 11a, and a liquid crystal layer 11c. The CF board 11a is arranged opposite the array board 11b. The liquid crystal layer 11c is arranged between the array board 11b and the CF board 11a. According to the liquid crystal panel 11, the array board 11b is less likely to cause malfunctions of the non-display area TFTs 29. Namely, the liquid crystal panel 11 has high reliability in operation thereof.

Second Embodiment

A second embodiment according to the present invention will be described with reference to FIGS. 9 and 10. The second embodiment includes a first interlayer insulation film 139 having a double-layered structure in the non-display area NAA. Similar configurations, operations, and effects to the first embodiment described above will not be described.

Figure 9:
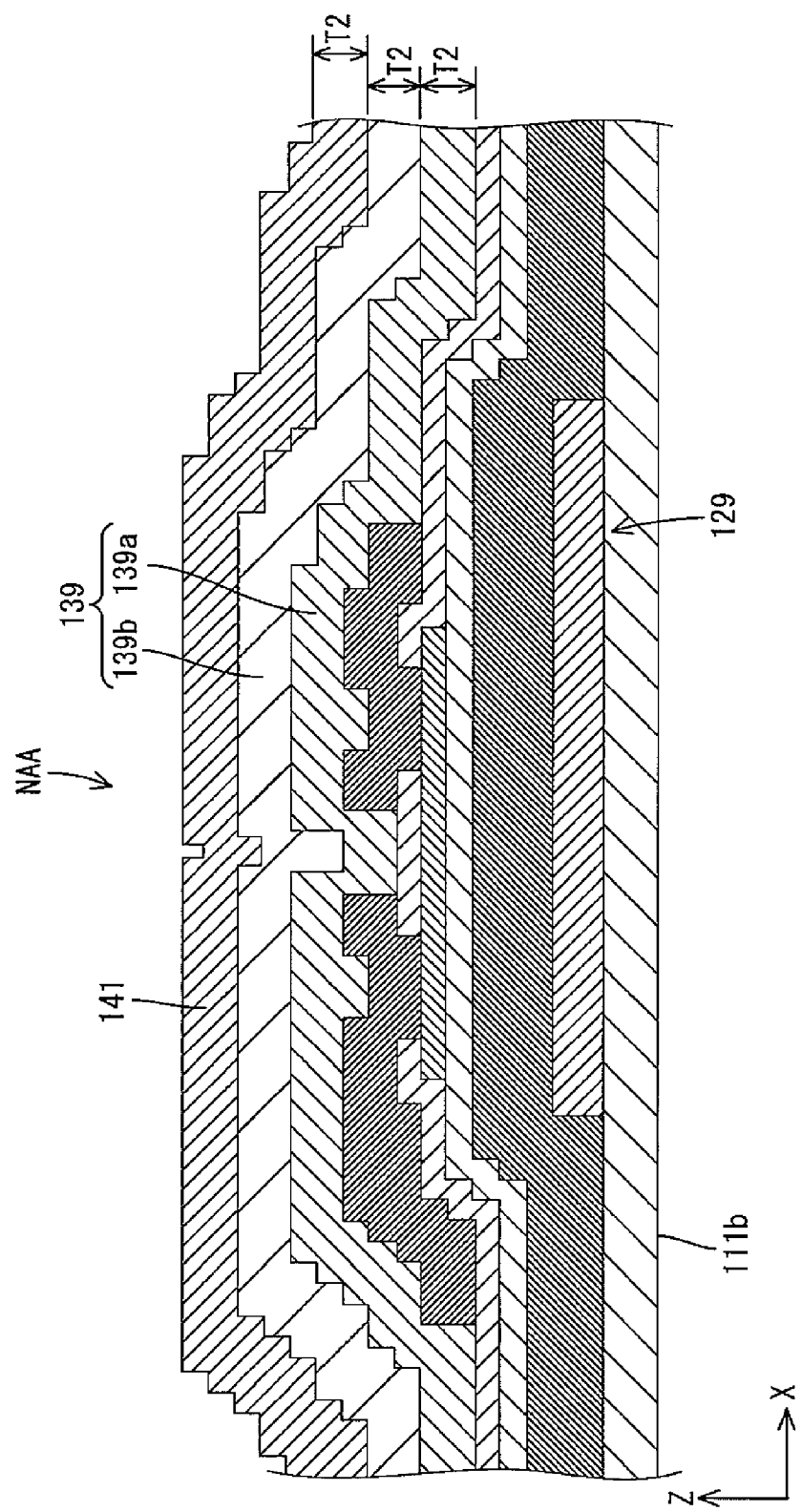
FIG. 9 is a cross-sectional view illustrating a cross-sectional configuration of a non-display area TFT according to a second embodiment of the present invention.
Figure 10:
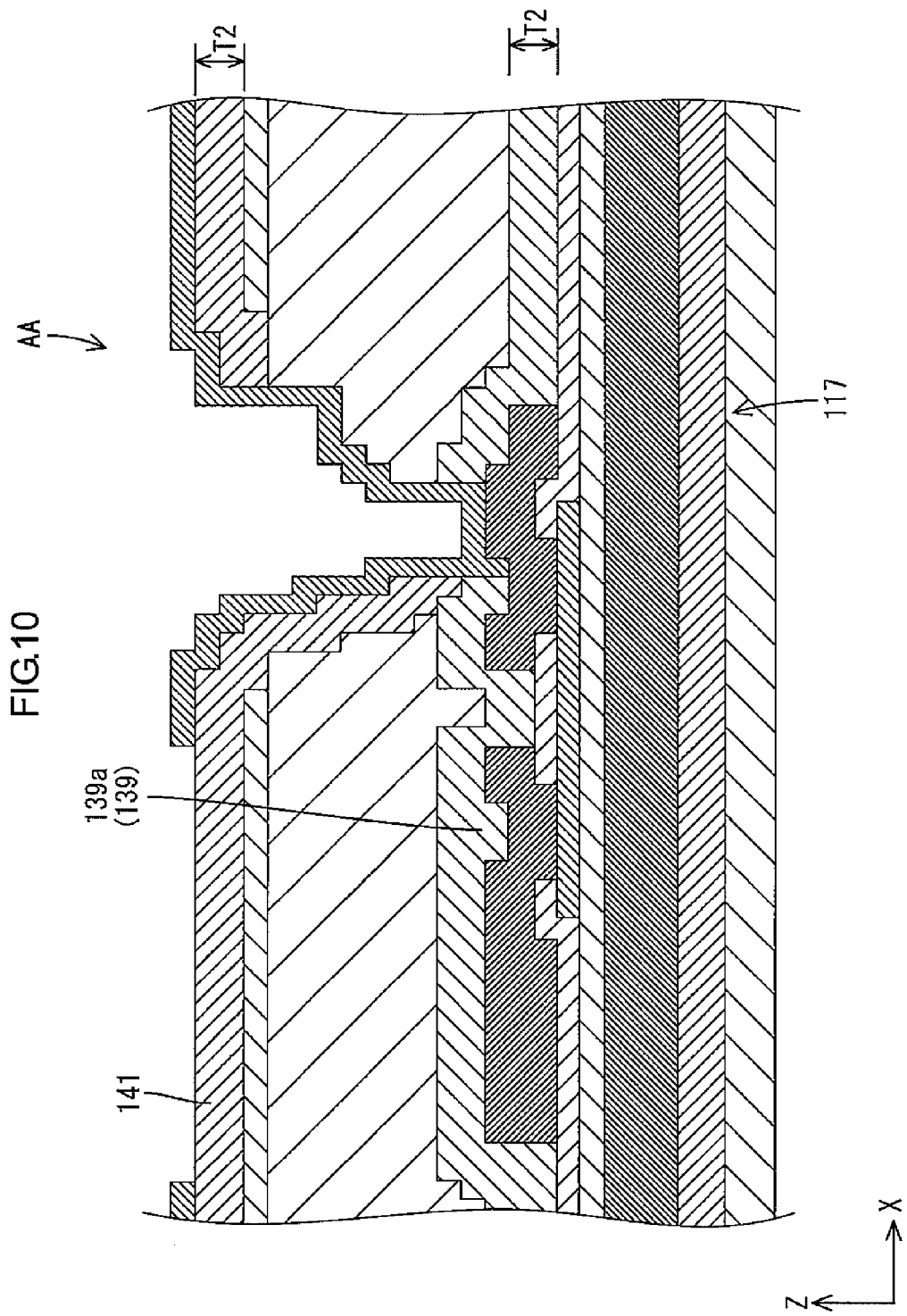
FIG. 10 is a cross-sectional view illustrating a cross-sectional configuration of a display area TFT.

As illustrated in FIGS. 9 and 10, the first interlayer insulation film 139 according to this embodiment has a single-layered structure in the display area AA but has a double-layered structure in the non-display area NAA. In the non-display area NAA, the first interlayer insulation film 139 that overlaps non-display area TFTs 129 in a plan view in the non-display area NAA includes a lower first interlayer insulation film 139a and an upper first interlayer 139b. The first interlayer insulation film 139 that overlaps display area TFTs 117 in a plan view in the display area NAA only includes a lower first interlayer insulation film 139a. In a fabrication process of the array board 111b, the lower first interlayer insulation film 139a is formed in the display area AA and the non-display area NAA and then the upper first interlayer insulation film 139b is selectively formed only in the non-display area NAA. A thickness of the lower first interlayer insulation film 139a and a thickness of the upper first interlayer insulation film 139b are equal to a thickness T2 of a second interlayer insulation film 141. In the non-display area NAA, a thickness of the first interlayer insulation film 139 is about two times larger than the thickness T2 of the second interlayer insulation film 141.

Third Embodiment

A third embodiment according to the present invention will be described with reference to FIG. 11. The third embodiment includes a first interlayer insulation film 239 having a thickness larger than that of the first embodiment. Similar configurations, operations, and effects to the first embodiment will not be described.

Figure 11:
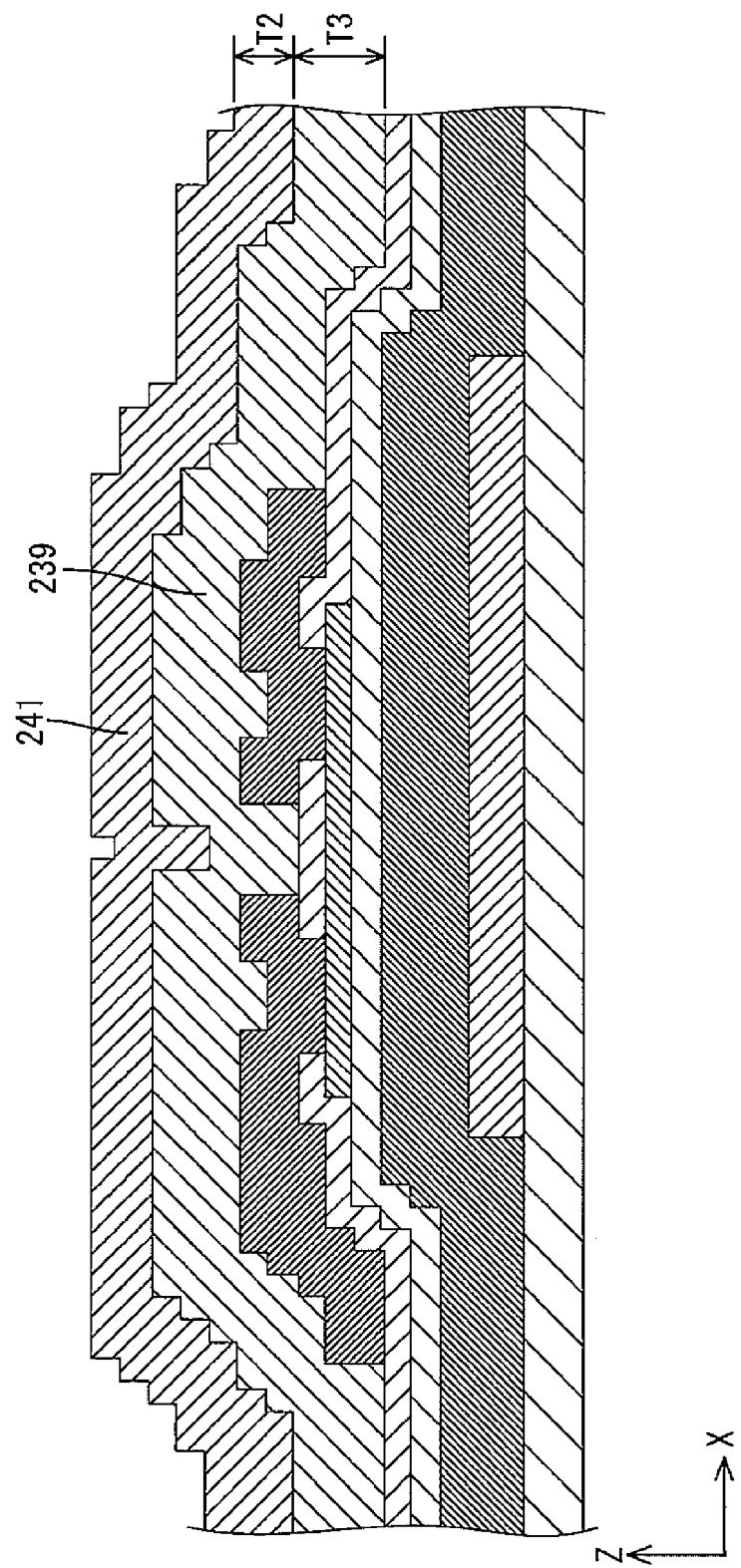
FIG. 11 is a cross-sectional view illustrating a cross-sectional configuration of a non-display area TFT according to a third embodiment of the present invention.

As illustrated in FIG. 11, the first interlayer insulation film 239 has a thickness T3 that is about one-and-a-half larger than the thickness T2 of a second interlayer insulation film 241. To set the thickness of the first interlayer insulation film 239, the thickness of the first interlayer insulation film 239 may be altered according to a content of hydrogen in the second interlayer insulation film 241 made of silicon nitride. In this embodiment, the content of hydrogen in the second interlayer insulation film 241 is smaller than the content of hydrogen in the second interlayer insulation film 41 in the first embodiment. Therefore, the thickness T3 of the first interlayer insulation film 239 is smaller than the thickness of the first interlayer insulation film 39 in the first embodiment.

Fourth Embodiment

A fourth embodiment according to the present invention will be described with reference to FIG. 12. The fourth embodiment includes a first interlayer insulation film 339 having a thickness larger than that of the first embodiment. Similar configurations, operations, and effects to the first embodiment will not be described.

Figure 12:
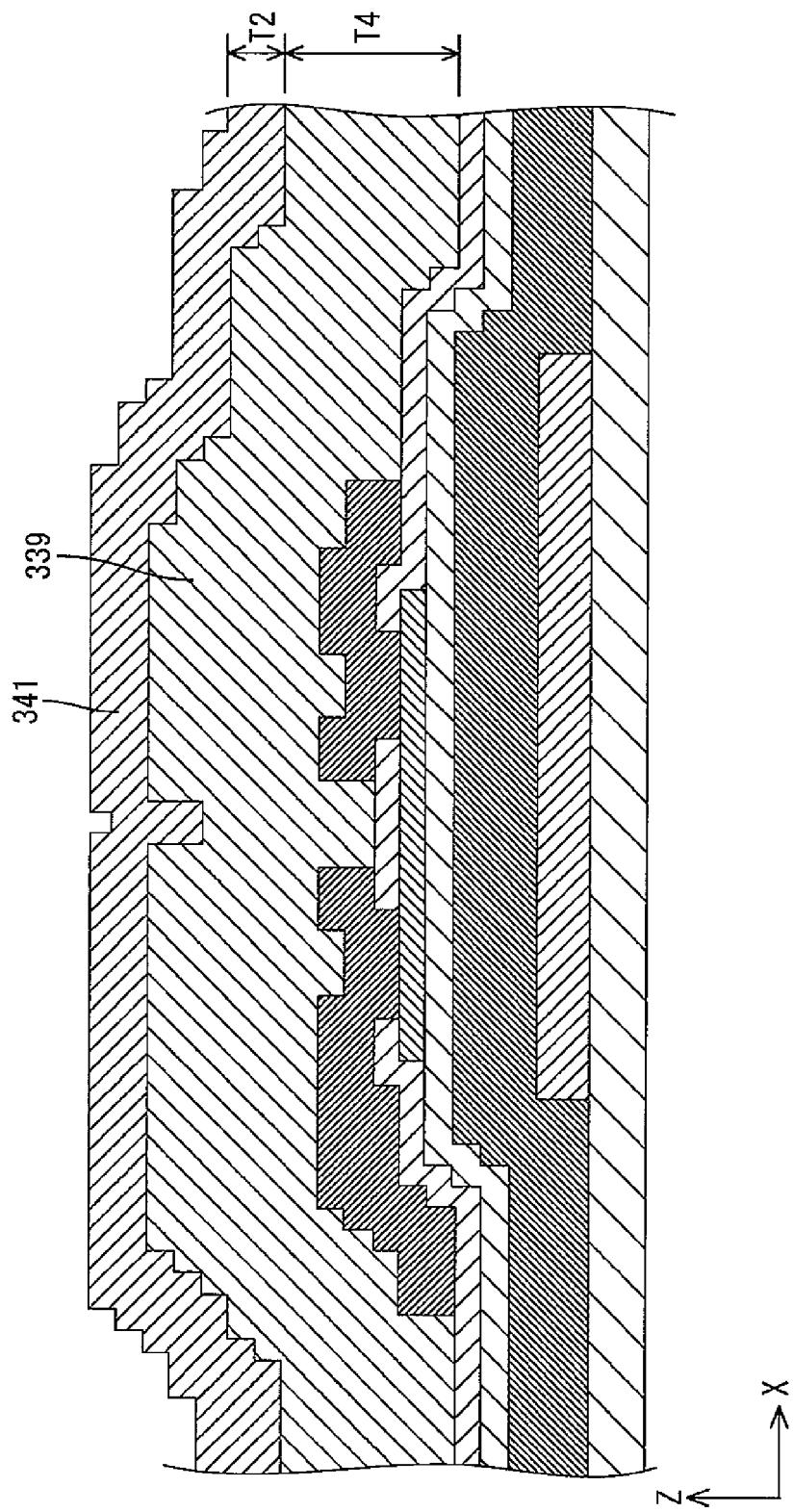
FIG. 12 is a cross-sectional view illustrating a cross-sectional configuration of a non-display area TFT according to a fourth embodiment of the present invention.

As illustrated in FIG. 12, the first interlayer insulation film 339 according to this embodiment has a thickness T4 that is about three times larger than the thickness T2 of a second interlayer insulation film 341. In this embodiment, a content of hydrogen in the second interlayer insulation film 341 is larger than the content of hydrogen in the second interlayer insulation film 41 in the first embodiment. Therefore, the thickness T4 of the first interlayer insulation film 339 is set larger than the thickness of the first interlayer insulation film 39 in the first embodiment.

Fifth Embodiment

A fifth embodiment according to the present invention will be described with reference to FIG. 13. The fourth embodiment includes a first interlayer insulation film 439 having a thickness further larger than that of the first embodiment. Similar configurations, operations, and effects to the first embodiment will not be described.

Figure 13:
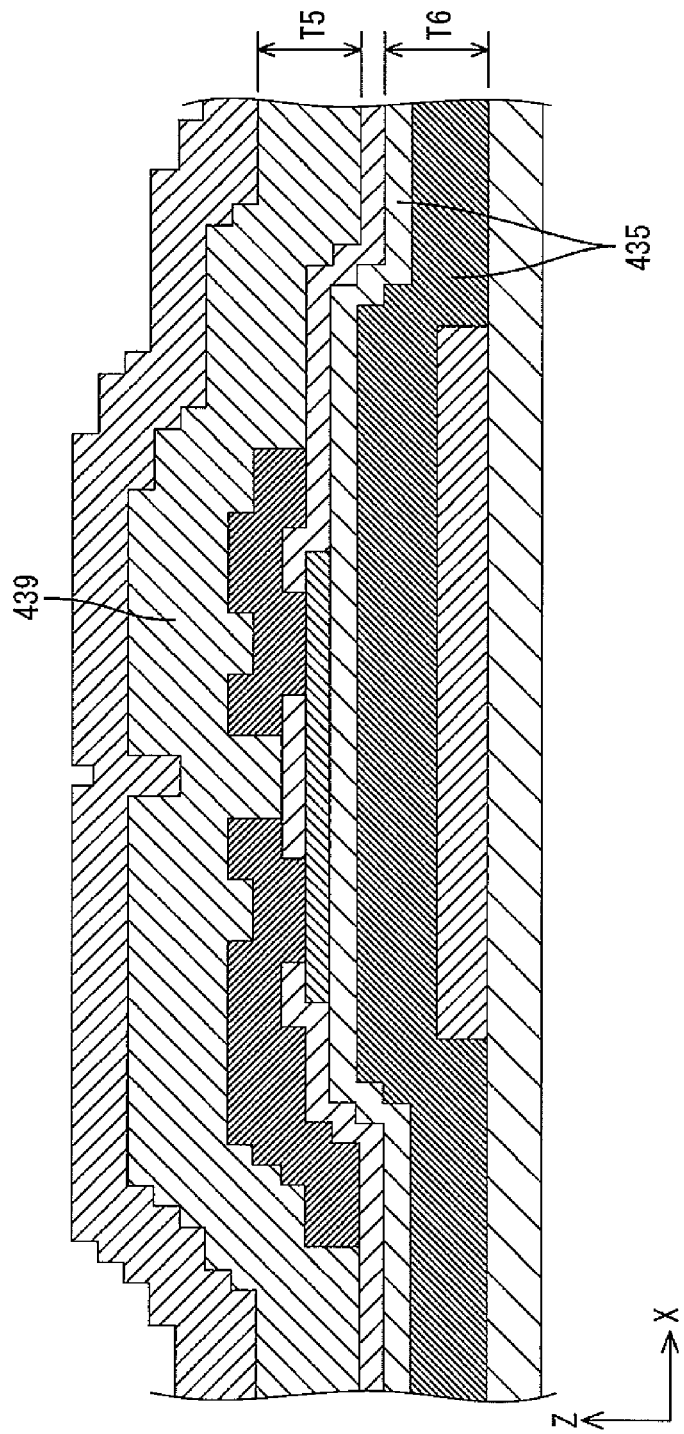
FIG. 13 is a cross-sectional view illustrating a cross-sectional configuration of a non-display area TFT according to a fifth embodiment of the present invention.

As illustrated in FIG. 13, the first interlayer insulation film 439 according to this embodiment has a thickness T5 about equal to a thickness T6 of a gate insulator 435.

Sixth Embodiment

A sixth embodiment according to the present invention will be described with reference to FIGS. 14 and 15. The sixth embodiment does not include the protection film 37 in the first embodiment. Similar configurations, operations, and effects to the first embodiment will not be described.

Figure 14:
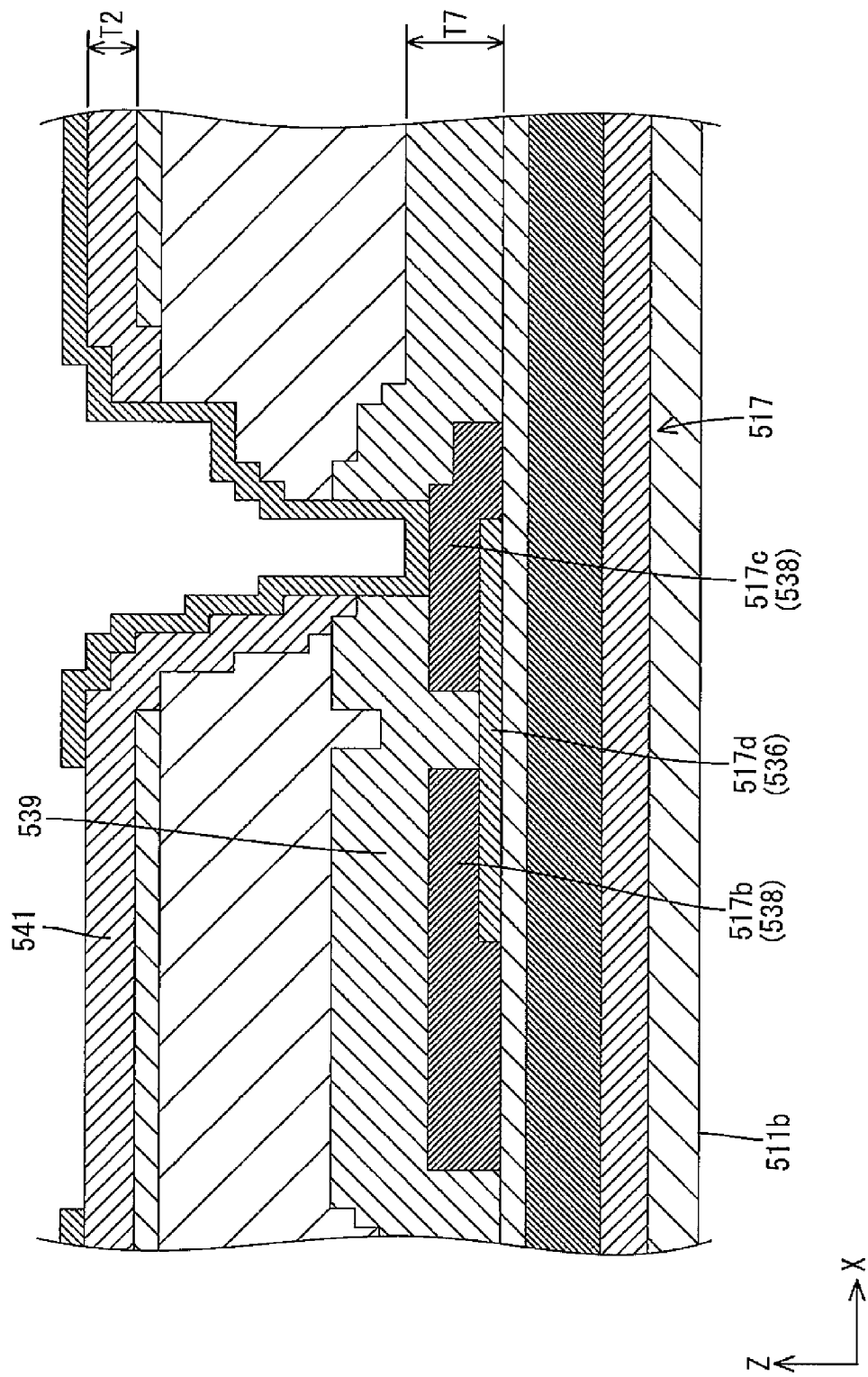
FIG. 14 is a cross-sectional view illustrating a cross-sectional configuration of a display area TFT according to a sixth embodiment of the present invention.
Figure 15:
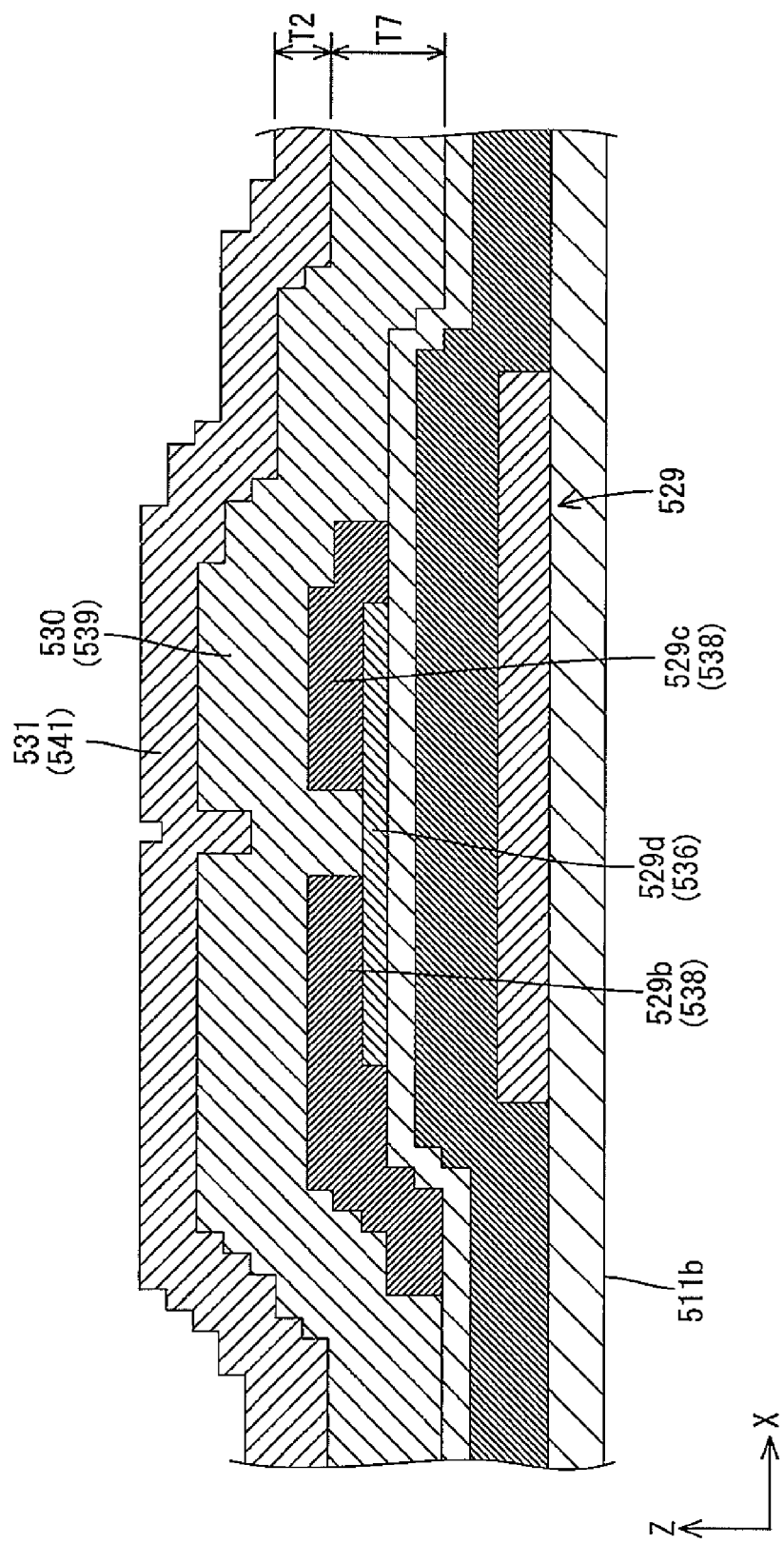
FIG. 15 is a cross-sectional view illustrating a cross-sectional configuration of a non-display area TFT.

As illustrated in FIGS. 14 and 15, an array board 511b according to this embodiment includes a second metal film 538 layered directly on a semiconductor film 536. The protection film 27 in the first embodiment is not arranged between the films 536 and 538. In each of display area TFTs 517, as illustrated in FIG. 14, a first source electrode 517b and a first drain electrode 517c are layered directly on ends of a first channel 517d and connection therebetween is established. The first channel 517d is formed from the semiconductor film 536. The first source electrode 517b and the first drain electrode 517c are formed from the second metal film 538. Similarly, in each of non-display area TFTs 529, as illustrated in FIG. 15, a second source electrode 529b and a second drain electrode 529c are layered directly on ends of a second channel 529d and connection therebetween is established. The second channel 529d is formed from the semiconductor film 536. The second source electrode 529b and the second drain electrode 529c are formed from the second metal film 538. A lower insulator 530 in each non-display area TFT 529 is formed only from the first interlayer insulation film 539. A thickness T7 of the lower insulator 530 formed only from the first interlayer insulation film 539 is larger than the thickness T2 of an upper insulator 531 formed from a second interlayer insulation film 541. According to this configuration, a layer below the first interlayer insulation film 539 (or the lower insulator 530) is less likely to be damaged during formation of the second interlayer insulation film 541 (or the upper insulator 531) in a fabrication process of the array board 511b.

Seventh Embodiment

A seventh embodiment according to the present invention will be described with reference to FIG. 16. The seventh embodiment includes a second protection portion 629e having a different configuration. The second protection portion 629e is a component of non-display area TFTs 629. Similar configurations, operations, and effects to the first embodiment will not be described.

Figure 16:
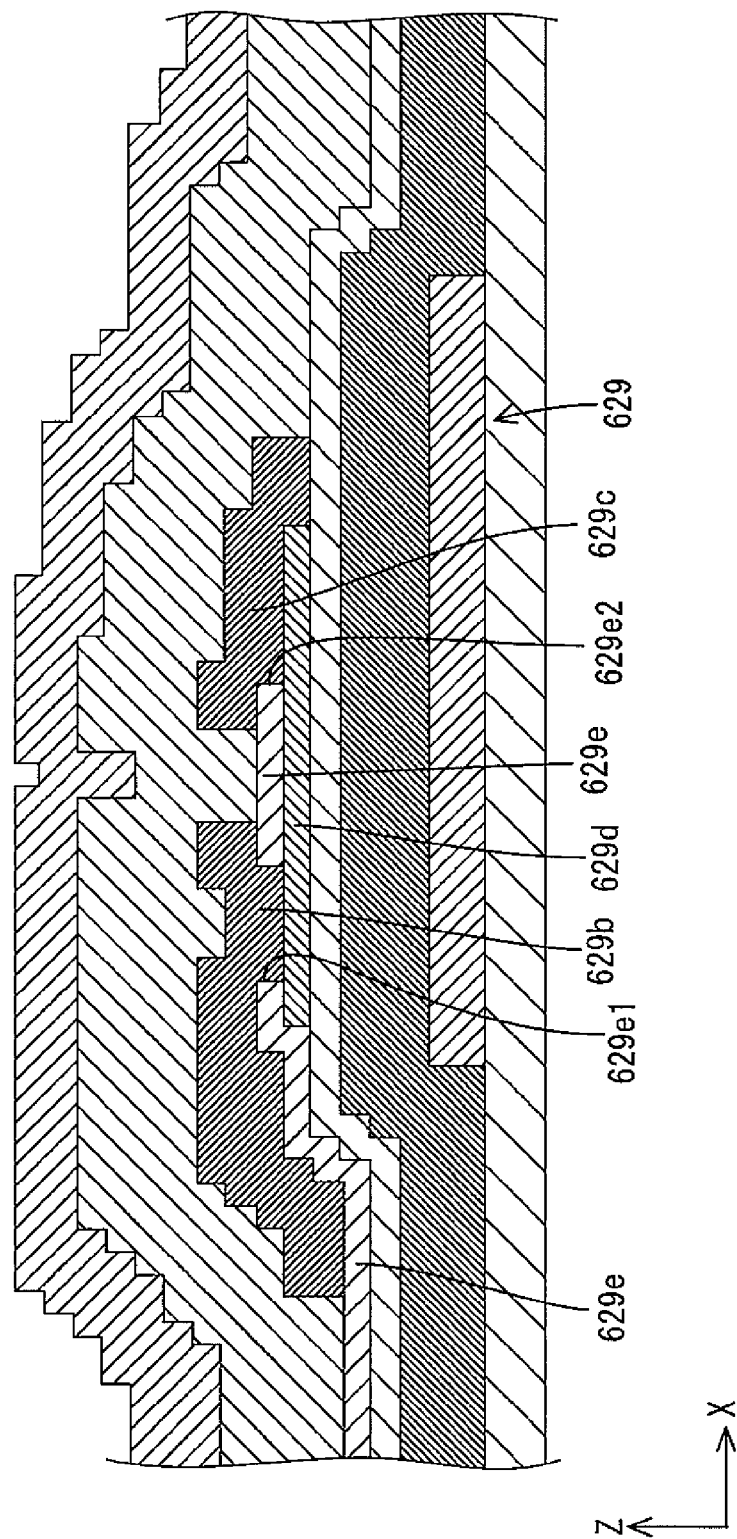
FIG. 16 is a cross-sectional view illustrating a cross-sectional view of a non-display area TFT according to a seventh embodiment of the present invention.

As illustrated in FIG. 16, the second protection portion 629e, which is a component of each non-display area TFT 629 according to this embodiment, does not include a portion that is father from a second source electrode 629e than a connecting portion of a second drain electrode 629c with a second channel 629d (on the right in FIG. 16). Namely, one of two second through holes 629e1 and 6292e in the second protection portion 629e on a second drain electrode 629c side, that is, the second through hole 629e2 is expanded in comparison to the first embodiment. The second drain electrode 629c is layered directly on an end of the second channel 629d and connected.

Other Embodiments

The present invention is not limited to the embodiments described above and illustrated by the drawings. For examples, the following embodiments will be included in the technical scope of the present invention.

(1) The thickness of the lower insulator (the first interlayer insulation film and the protection film) may be altered from that of the above embodiments as appropriate in terms of a relative value (especially relative to the thickness of the second interlayer insulation film, which is a component of the upper insulator), and an absolute value.

(2) Each of the above embodiments includes the non-display area TFTs that are arranged in the non-display area and configured to output scan signals at the final stage of the signal processing performed by the scanning circuit. However, non-display area TFTs configured to perform other functions are also included in the scope of the present invention.

(3) The non-display area TFTs that perform various functions are arranged in the non-display area. It is not necessary to omit the organic insulation films from those non-display area TFTs. For example, the following non-display area TFTs may include the organic insulation films: the non-display area TFTs connected to the non-display area TFTs that are configured to output scan signals at the final stage of the signal processing performed by the scanning circuit and currents handled by which are small. A yield may improve as a larger number of the organic insulation films remains.

(4) Each of the above embodiments includes the non-display area TFTs in the row control circuit arranged in the non-display area. However, non-display area TFTs included in the column control circuit arranged in the non-display area is also in the scope of the present invention.

(5) The materials of the gate insulators, the protection films, the first interlayer insulation films, the organic insulation films, and the second interlayer insulation films may be altered from those of the above embodiments as appropriate.

(6) In each of the above embodiments, the oxide semiconductor used for the semiconductor film is an oxide thin film that contains indium (In), gallium (Ga), and zinc (Zn). However, other types of oxide semiconductors may be used. Examples of oxides include an oxide that contains indium (In), silicon (Si), and zinc (Zn), an oxide that contains indium (In), aluminum (Al), and zinc (Zn), an oxide that contains tin (Sn), silicon (Si), and zinc (Zn), an oxide that contains tin (Sn), aluminum (Al), and zinc (Zn), an oxide that contains tin (Sn), gallium (Ga), and zinc (Zn), an oxide that contains gallium (Ga), silicon (Si), and zinc (Zn), an oxide that contains gallium (Ga), aluminum (Al), and zinc (Zn), an oxide that contains indium (In), copper (Cu), and zinc (Zn), and an oxide that contains tin (Sn), copper (Cu), and zinc (Zn).

(7) In the above embodiments, each of the display area TFTs, the non-display area TFTs, the column control circuits, and the row control circuits includes the oxide thin films that contains indium (In), gallium (Ga), and zinc (Zn). However, a semiconductor film formed from amorphous silicon (a-Si) or polysilicon may be used. For example, a continuous grain silicon thin film may be used.

(8) Each of the above embodiments includes the liquid crystal panel that includes an FFS mode as an operation mode. However, other liquid crystal panels are also included in the scope of the present invention, for example, a liquid crystal panel that includes an in-plane switching (IPS) mode or a vertical alignment (VA) mode as an operation mode is also included in the scope of the present invention.

(9) Each of the above embodiments includes the first metal film and the second metal film that are formed from a stacked film of titanium (Ti) and copper (Cu). However, the following materials may be used instead of titanium: molybdenum (Mo), molybdenum nitride (MoN), titanium nitride (TiN), tungsten (W), niobium (Nb), molybdenum-titanium alloy (MoTi), and molybdenum-tungsten (MoW) alloy. Furthermore, single-layered metal films such as titanium, cupper, and aluminum films may be used.

(10) Each of the above embodiments includes the driver that is directly mounted on the array board through the COG method. A driver that is mounted on a flexible printed circuit board that is connected to the array board via an ACF is also included in the scope of the present invention.

(11) Each of the above embodiments includes the column control circuit and the row control circuit arrange in the non-display area of the array board. However, any one of the column control circuit and the row control circuit may be omitted, and the driver may be configured to perform the functions of the omitted circuit.

(12) Each of the above embodiments includes the liquid crystal panel having a vertically-long rectangular shape. However, liquid crystal panels having a horizontally-long rectangular shape of a square shape are also included in the scope of the present invention.

(13) Each of the above embodiments may further include a functional panel, such as a touch panel and a parallax barrier panel (a switching liquid crystal panel), layered and attached to the liquid crystal panel.

(14) The liquid crystal display device according to the above embodiments includes the edge-light type backlight unit. However, the liquid crystal display device may include a direct backlight unit.

(15) The transmission type liquid crystal display devices each including the backlight unit, which is an external light source, are described as the embodiments. However, reflection type liquid crystal display devices that use outside light to display images are also included in the scope of the present invention. The reflection type liquid crystal display devices do not require backlight units.

(16) Each of the above embodiments includes the TFTs as switching components of the liquid crystal display device. However, liquid crystal display devices that include switching components other than TFTs (e.g., thin film diodes (TFTs)) may be included in the scope of the present invention. Furthermore, black-and-white liquid crystal display devices, other than color liquid crystal display device, are also included in the scope of the present invention.

(17) The liquid crystal display devices including the liquid crystal panels as the display panels are described as the embodiments. However, display devices that include other types of display panels (e.g., plasma display panels (PDPs) and organic EL panels) are also included in the scope of the present invention. Such display devices do not require backlight units.

(18) The above embodiments include the liquid crystal panels that are classified as small sized or small to middle sized panels. Such liquid crystal panels are used in electronic devices including PDAs, mobile phones, notebook computers, digital photo frames, portable video games, and electronic ink papers. However, liquid crystal panels that are classified as middle sized or large sized (or supersized) panels having screen sizes from 20 inches to 90 inches are also included in the scope of the present invention. Such display panels may be used in electronic devices including television devices, digital signage, and electronic blackboard.

(19) During formation of contact holes in each of the above embodiments, the first interlayer insulation film and the organic insulation film are etched using the second interlayer insulation film having the hole as a resist. However, the holes of the first interlayer insulation film, the organic insulation film, and the second interlayer insulation film may be formed, respectively, by patterning during formation thereof.

(20) Each of the above embodiments includes the display area TFTs arranged on the gate lines. However, the display area TFTs may be arranged such that the display area TFTs do not overlap the gate lines in a plan view. In this case, the first gate electrodes may be formed so as to branch off from the gate lines. Furthermore, the display area TFTs may be arranged on specific traces.

EXPLANATION OF SYMBOLS

11: liquid crystal panel (display panel), 11a: CF board (opposite substrate), 11b, 11b, 511b: array board (semiconductor device), 11c: liquid crystal layer, 17, 117, 517: display area TFT (display area transistor), 17a: first gage electrode, 17b, 517b: first source electrode, 17c, 517c: first drain electrode, 17d, 517d: first channel, 17e: first protection portion, 17e1, 17e2: first through holes, 18: pixel electrode (second transparent electrode), 19: gate line (scan signal line), 22: common electrode (first transparent electrode), 23: first transparent electrode film, 24: second transparent electrode film, 25: first insulator, 26: buffer circuit, 29, 129, 529, 629: non-display area TFT (non-display area transistor), 29a: second gate electrode, 29b, 529b, 629b: second source electrode, 29c, 529c, 629c: second drain electrode, 29d, 529d, 629d: second channel, 29e, 629e: second protection portion, 29e1, 29e2, 629e1, 629e2: second through hole, 30, 530: lower insulator, 31, 531: upper insulator, 34: first metal film, 35, 435: gate insulator (first insulation film), 35a: lower gate insulator (lower first insulation film), 35b: upper gate insulator (upper first insulation film), 36, 526: semiconductor film, 37: protection film, 38, 528: second metal film, 39, 139, 239, 339, 439, 539: first interlayer insulation film (second insulation film), 40: organic insulation film, 41, 141, 241, 341, 541: second interlayer insulation film (third insulation film), AA: display area, CH: contact hole, GS: glass substrate (substrate), NAA: non-display area, T1-T7: thickness

The invention claimed is:
1. A semiconductor device comprising:
a substrate;
a first metal film formed on the substrate;
a first insulation film formed on at least the first metal film;
a semiconductor film formed on the first insulation film;
a second metal film formed on at least the semiconductor film;

a second insulation film formed on at least the second metal film;

an organic insulation film formed on the second insulation film;

a first transparent electrode film formed on the organic insulation film;

a third insulation film formed on at least the first transparent electrode film;

a second transparent electrode film formed on at least the third insulation film;

a display area for displaying images on a plate surface of the substrate;

a display area transistor arranged in the display area and including at least a first gate electrode, a first channel, a first source electrode, and a first drain electrode, the first gate electrode being formed from the first metal film, the first channel being formed from the semiconductor film and arranged so as to overlap the first gate electrode in a plan view, the first source electrode being formed from the second metal film and connected to the first channel, the first drain electrode being formed from the second metal film and connected to the first channel;

a first transparent electrode arranged in the display area and formed from the first transparent electrode film;

a first insulator arranged in the display area and formed from the second insulation film, the organic insulation film, and the third insulation film, the first insulator including a contact hole that is a through hole formed at a position that overlaps the first drain electrode in a plan view;

a second transparent electrode arranged in the display area and formed from the second transparent electrode film, the second transparent electrode being connected to the first drain electrode via the contact hole;

a non-display area arranged outside the display area on the plate surface of the substrate;

a non-display area transistor arranged in the non-display area and including at least a second gate electrode, a second channel, a second source electrode, and a second drain electrode, the second gate electrode being formed from the first metal film, the second channel being formed from the semiconductor film and arranged so as to overlap the second gate electrode in a plan view, the second source electrode being formed from the second metal film and connected to the second channel, the second drain electrode being formed from the second metal film and connected to the second channel;

an upper insulator arranged in the non-display area and formed from the third insulation film; and a lower insulator arranged in the non-display area and under the upper insulator, the lower insulator being formed from at least the second insulation film.

2. The semiconductor device according to claim 1, wherein the lower insulator has a thickness larger than a thickness of the upper insulator.

3. The semiconductor device according to claim 2, further comprising a protection film arranged at least between the semiconductor film and the second metal film for protecting the semiconductor film, wherein the display area transistor includes a first protection portion formed from the protection film, the first protection portion including two first through holes at positions that overlap the first channel in a plan view, the first source electrode is connected to the first channel via one of the first through holes, the first drain electrode is connected to the first channel via another one of the first through holes, the non-display area transistor includes a second protection portion formed from the protection film that includes two second through holes at positions that overlap the second channel in a plan view, the second source electrode is connected to the second channel via one of the second through holes, the second drain electrode is connected to the second channel via another one of the second through holes, and the lower insulator is formed from the second insulation film and the protection film.

4. The semiconductor device according to claim 3, wherein the protection film is made of silicon oxide.

5. The semiconductor device according to claim 2, wherein the second insulation film of the first insulator of the display transistor has a thickness larger than a thickness of the third insulation film of the first insulator and equal to a thickness of the second insulation film of the lower insulator of the non-display area transistor.

6. The semiconductor device according to claim 2, wherein the third insulation film is made of silicon nitride.

7. The semiconductor device according to claim 2, wherein the organic insulation film is made of acrylic resin.

8. The semiconductor device according to claim 1, wherein the semiconductor film is made of an oxide semiconductor.

9. The semiconductor device according to claim 1, further comprising:

a scanning line arranged in the display area and connected to the first gate electrode for transmitting a scan signal to the display transistor; and a buffer circuit arranged in the non-display area and connected to the scanning line for supplying the scan signal to the scanning line, wherein the non-display area transistor is a component of the buffer circuit.

10. The semiconductor device according to claim 1, wherein the second insulation film is made of silicon oxide.

11. The semiconductor device according to claim 1, wherein the first insulation film has a stacking structure in which a lower first insulation film and an upper first insulation film are stacked, the lower first insulation film being made of silicon nitride, the upper first insulation film being arranged between the lower first insulation film and the semiconductor film and made of silicon oxide.

12. The semiconductor device according to claim 1, wherein the second insulation film and the third insulation film have same patterns in a plan view for an entire area of the display area and an entire area of the non-display area.

13. A display device comprising:

the semiconductor device according to claim 1;

a counter substrate arranged opposite the semiconductor device; and a liquid crystal layer arranged between the semiconductor device and the counter substrate.

* * * * *